United States Patent
Lisoni Reyes et al.

(10) Patent No.: US 9,362,296 B2
(45) Date of Patent: Jun. 7, 2016

(54) NON-VOLATILE MEMORY SEMICONDUCTOR DEVICES AND METHOD FOR MAKING THEREOF

(71) Applicant: IMEC

(72) Inventors: Judit Gloria Lisoni Reyes, Oud-Heverlee (BE); Laurent Breuil, Etterbeek (BE); Pieter Blomme, Heverlee (BE); Jan Van Houdt, Bekkevoort (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 14/286,812

(22) Filed: May 23, 2014

(65) Prior Publication Data
US 2014/0346582 A1    Nov. 27, 2014

(30) Foreign Application Priority Data

May 24, 2013   (EP) ..................................... 13169160
Sep. 30, 2013  (EP) ..................................... 13186665

(51) Int. Cl.
*H01L 27/115*   (2006.01)
*H01L 21/28*    (2006.01)
*G11C 16/04*    (2006.01)

(52) U.S. Cl.
CPC ...... *H01L 27/11517* (2013.01); *G11C 16/0416* (2013.01); *H01L 21/28273* (2013.01)

(58) Field of Classification Search
None
See application file for complete search history.

(56) References Cited

U.S. PATENT DOCUMENTS

| | | |
|---|---|---|
| 6,617,639 B1 | 9/2003 | Wang et al. |
| 7,989,289 B2 | 8/2011 | Krishnamohan et al. |
| 7,989,871 B2 | 8/2011 | Yasuda |
| 2009/0140317 A1 | 6/2009 | Rosmeulen |
| 2009/0321810 A1 | 12/2009 | Ryu et al. |
| 2011/0101438 A1 | 5/2011 | Yoo et al. |
| 2013/0341699 A1* | 12/2013 | Sato ................. H01L 29/788 257/316 |
| 2014/0239373 A1* | 8/2014 | Murakoshi ........ H01L 29/66825 257/324 |

FOREIGN PATENT DOCUMENTS

| | | |
|---|---|---|
| EP | 1 903 602 A2 | 3/2008 |
| WO | WO 2010-042323 A1 | 4/2010 |

OTHER PUBLICATIONS

Blomme et al., "Hybrid floating gate cell for sub-20-nm NAND flash memory technology," *IEEE Electron Device Letters*, vol. 33, No. 3, pp. 333-335 (Mar. 2012).

(Continued)

*Primary Examiner* — Yasser A Abdelaziez
(74) *Attorney, Agent, or Firm* — Knobbe, Martens, Olson & Bear LLP

(57) ABSTRACT

The disclosed technology generally relates to memory devices, and more particularly to memory devices having an intergate dielectric stack comprising multiple high k dielectric materials. In one aspect, a planar non-volatile memory device comprises a hybrid floating gate structure separated from an inter-gate dielectric structure by a first interfacial layer which is designed to be electrically transparent so as not to affect the program saturation of the device. The inter-gate structure comprises a stack of three layers having a high-k/low-k/high-k configuration and the interfacial layer has a higher k-value than its adjacent high-k layer in the inter-gate dielectric structure. A method of making such a non-volatile memory device is also described.

20 Claims, 14 Drawing Sheets

(56) References Cited

OTHER PUBLICATIONS

European Search Report dated Apr. 11, 2014 in European Patent Application No. 13186665.9.

Wellekens et al., "An Ultra-Thin Hybrid Floating Gate Concept for Sub-20nm NAND Flash Technologies," *Memory Workshop (IMW), 2011 3rd IEEE International, IEEE* 978-1-4577-0226, 4 pgs. (May 22, 2011).

* cited by examiner

NON-VOLATILE MEMORY SEMICONDUCTOR DEVICES AND METHOD FOR MAKING THEREOF

INCORPORATION BY REFERENCE TO RELATED APPLICATIONS

Any and all priority claims identified in the Application Data Sheet, or any correction thereto, are hereby incorporated by reference under 37 CFR 1.57. This application claims to the benefit of European patent application EP 13169160.2, filed on May 24, 2013, and European patent application EP 13186665.9, filed on Sep. 30, 2013. The aforementioned applications are incorporated by reference herein in their entireties, and are hereby expressly made a part of this specification.

FIELD OF THE INVENTION

The disclosed technology generally relates to memory devices, and more particularly to non-volatile memory devices having an intergate dielectric stack comprising multiple high k dielectric materials, and methods of making thereof.

BACKGROUND OF THE INVENTION

Multiple layer floating gate non-volatile memory devices are described in US-A-2009/0140317. In such devices, the floating gate comprises at least two layers constructed in different conductive or semiconductive materials. An intermediate dielectric layer of a predetermined thickness is used to separate at least two of the layers of floating gate to enable a direct tunnelling current between the two separated layers.

When implementing planar non-volatile memory cells, program saturation can be an important factor for designing various elements of the non-volatile memory cells. For non-volatile memory cells at sub-20 nm "node" in which half-pitch of the memory cells are sub-20 nm, unwanted fringing capacitances can lead to unacceptable levels of cell-to-cell interference and loss of gate coupling ratio (GCR).

For lateral scaling of NAND planar flash memory cells below about the 20 nm node, in order to reduce the effects cell-to-cell interference, and because of lack of physical space between neighbouring cells, a fully planar cell architecture has been proposed, where the control gate is no longer wrapped around the floating gate. One drawback of the planar cell architecture is a large reduction of the GCR, whose effect includes a reduction in the threshold voltage (Vth) window. This reduction in the Vth window can partially be mitigated by using a hybrid floating gate, where a high work-function metal is formed on top of the silicon (Si) floating gate. Such a structure limits the leakage through the inter-gate dielectric during programming, and therefore enables a larger programming window. Such a hybrid floating gate cell with a floating gate comprising a titanium nitride (TiN) metal layer on a poly-Si layer is disclosed, for example, in IEEE Electron Device Letters Vol. 33, no.3, March 2012, pages 333-335 by P. Blomme et al. "Hybrid floating gate cell for sub-20-nm NAND flash memory technology". In this reference, the inter-gate dielectric of choice was aluminium oxide ($Al_2O_3$), a material with a k-value of about 8. However, a higher k inter-gate dielectric is still required in order to increase the coupling ratio and allow further voltage scaling. The inter-gate dielectric also needs to have low leakage in order to avoid charge loss and program saturation which is due to charge passing through the inter-gate dielectric during the programming operation. To this end, a high-k/low-k materials combination can reduce the charge flow through the inter-gate dielectric by increasing the tunnelling distance at the floating gate side during programming.

U.S. Pat. No. 7,989,871 describes embodiments of non-volatile memory devices which comprise a substrate, a tunnel dielectric, a floating gate, an interfacial layer, an inter-gate dielectric and a control gate arranged as layers in ascending order on the substrate. Various combinations of materials are disclosed for these devices together with layer thicknesses.

SUMMARY OF CERTAIN INVENTIVE ASPECTS

The disclosed technology generally relates to memory devices, and more particularly to non-volatile memory devices having an intergate dielectric stack comprising multiple high k dielectric materials. It is an object of the present disclosure to provide a non-volatile memory device with improved device characteristics such larger threshold voltage window by increasing, for example the program saturation threshold voltage of the memory cell.

In accordance with one aspect of the present disclosure, there is provided a non-volatile memory device comprising: a substrate; a tunnel dielectric layer formed on the substrate; a floating gate structure formed on the tunnel dielectric layer; at least a first interfacial layer formed on the floating gate structure; an inter-gate dielectric structure formed on the first interfacial layer; and a control gate structure formed on the inter-gate dielectric structure; characterised in that the inter-gate dielectric structure comprises at least a first layer, a second layer and a third layer, the first layer being formed on the first interfacial layer and the control gate structure being formed on the third layer, the first and third layers having a higher k-value than the second layer which is sandwiched therebetween; and in that the first interfacial layer comprises a high k-value material having a thickness such that the potential drop across the first interfacial layer is below a predetermined value.

By providing a three-layer inter-gate dielectric structure together with a specifically designed high-k first interfacial layer between the floating gate and the inter-gate dielectric structure, the coupling ratio can be optimised in a planar non-volatile memory device without having the problems associated with prior art devices.

In some embodiments, the floating gate structure comprises a hybrid floating gate structure having at least a first lower layer and a second upper metal layer.

In one embodiment, the first and third layers of the inter-gate dielectric structure may comprise hafnium aluminate layers. The second layer of the inter-gate dielectric structure may comprise one of: an aluminium oxide layer and a silicon oxide layer. The aluminium oxide layer may be annealed to provide a crystalline layer or it may comprise an amorphous layer.

It will be appreciated that by having an inter-gate dielectric structure comprising a stack of high-k/low-k/high-k layers, a high-k layer is present at both the floating gate structure and the control gate structure.

The first interfacial layer preferably comprises a higher k-value dielectric material than the first layer of the inter-gate dielectric structure. It may comprise metal elements of the adjacent second layer of the floating gate structure.

Advantageously, the first interfacial layer is electrically transparent so as not to affect the program saturation of the non-volatile memory device.

Additionally, a second interfacial layer may be provided which is located between the inter-gate dielectric structure and the control gate structure. The second interfacial layer preferably comprises a higher k-value dielectric material than the third layer of the inter-gate dielectric structure. It may comprise metal elements of the adjacent control gate structure.

In some embodiments, each of the first and second interfacial layers has a thickness of less than 1 nm. The thickness of each of the first and second interfacial layers may be in the range from 0.1 nm to 0.7 nm.

It is an advantage of embodiments of the present disclosure that the facing area of the non-volatile memory device is increased and without deterioration in the coupling ratio.

In accordance with another aspect of the present disclosure, there is provided a method of manufacturing a non-volatile memory device according to any one of the preceding claims, the method comprising the steps of:
 a) forming a tunnel dielectric layer on a semiconductor substrate;
 b) forming a floating gate structure on the tunnel dielectric layer;
 c) forming a first interfacial layer on of the floating gate structure;
 d) forming an inter-gate dielectric structure on the interfacial layer; and
 e) forming a control gate structure on the inter-gate dielectric structure; characterized in that step d) further comprises the steps of:—
 d1) forming the inter-gate dielectric structure as at least a first layer, a second layer, and a third layer; and
 d2) selecting the materials for each of the first, second and third layers such that the first and third layers comprise a high-k dielectric material and the second layer comprises a dielectric material with a lower k-value than the first and third layers;
 and in that step c) comprises selecting the material for the first interfacial layer to be a high-k dielectric material.

Step c) may comprise forming the first interfacial layer as a part of the formation of the first layer of the inter-gate dielectric structure. Alternatively, the first interfacial layer may be deposited separately in a different process.

The method may further comprise step f) forming a second interfacial layer on the inter-gate dielectric structure prior to step e).

Step f) may comprise forming the second interfacial layer as a part of the formation of the third layer of the inter-gate dielectric structure. Alternatively, the second interfacial layer may be deposited separately in a different process.

BRIEF DESCRIPTION OF THE DRAWINGS

For a better understanding, reference will now be made, by way of examples, to the accompanying drawings in which:—

DETAILED DESCRIPTION OF CERTAIN ILLUSTRATIVE EMBODIMENTS

Figure 1:
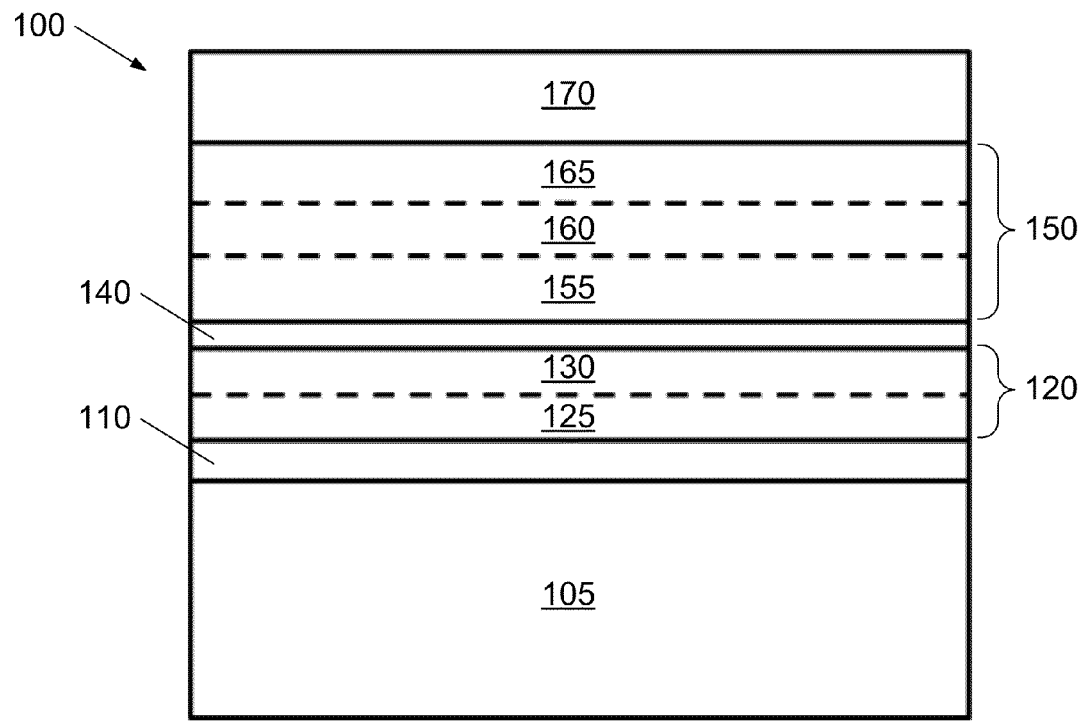
FIG. 1 is a schematic cross-sectional illustration of a non-volatile semiconductor device including an inter-gate dielectric stack and a first interfacial layer formed between the floating gate and the inter-gate dielectric stack, according to some embodiments.

The present invention will be described with respect to particular embodiments and with reference to certain drawings but the invention is not limited thereto. The drawings described are only schematic and are non-limiting. In the drawings, the size of some of the elements may be exaggerated and not drawn on scale for illustrative purposes.

The terms "upper", "lower", "top", "bottom", "vertical" and "horizontal" as used herein refer to the relative orientation of the embodiments illustrated in drawings and is not intended to be limiting to a specific configuration.

The term "H/A/H" (or "HAH") as used herein refers to a an inter-gate dielectric (IGD) stack or structure which includes H which represents hafnium aluminate (HfAlO) and A which represents aluminium oxide ($Al_2O_3$) that has been subjected to a post-deposition anneal (PDA) at a temperature, for example, of 1000° C. In some embodiments, $Al_2O_3$ annealed under such a temperature is in a crystalline state. In these embodiments, an H/A/H IGD structure or stack thus comprises a layer of annealed or crystalline $Al_2O_3$ sandwiched in between two HfAlO layers.

The term "HaH" as used herein refers to an IGD stack or structure which includes H which represents HfAlO and A which represents $Al_2O_3$ that has not been subjected to a PDA. In some embodiments, an unannealed $Al_2O_3$ is in its amorphous state. An HaH IGD structure or stack can thus comprise a layer of unannealed or amorphous $Al_2O_3$ sandwiched in between two HfAlO layers.

The term "H/O/H" (or "HOH") as used herein refers to an IGD stack or structure which includes H which represents HfAlO and O which represents silicon oxide, e.g., silicon dioxide ($SiO_2$). An H/O/H IGD structure or stack can thus comprise a layer of $SiO_2$ sandwiched in between two HfAlO layers.

The term "A/H/A" (or "AHA") as used herein refers to an IGD stack or structure which includes A which represents $Al_2O_3$ and H which represents HfAlO. An AHA IGD structure or stack thus comprises a layer of HfAlO sandwiched between two annealed or crystalline $Al_2O_3$ layers.

The terms "AHa", "aHA" or "aHa" as used herein refer to an IGD stack or structure which includes A which represents PDA $Al_2O_3$, a which represents amorphous $Al_2O_3$ and H which represents HfAlO. In this case, the layer of HfAlO is sandwiched between one unannealed (which can be amorphous) and one annealed $Al_2O_3$ layer (which can be crystalline) or two amorphous $Al_2O_3$ layers (which can be amorphous).

It will be appreciated that as described herein, HfAlO can refer to a $HfAlO_x$ material having a suitable x, where x can be between about 2 and about 4.

The terms "high-k dielectric" or "high-k material" as used herein refer to a dielectric material having a dielectric constant, k, which is higher than the dielectric constant of stoichiometric $SiO_2$, which is known to be about 3.9. High-k dielectric materials allow for a larger physical thickness compared to $SiO_2$ for a given effective capacitance or a given effective oxide thickness (EOT) of a $SiO_2$ layer.

The terms "low-k dielectric" or "low-k material" as used herein refer to a dielectric material having a dielectric constant, k, which is the same or lower than the dielectric constant of stoichiometric $SiO_2$, for which k is known to be about or greater 3.9.

The term "k-value" as used herein refers to the dielectric constant of the dielectric material, and can be expressed as a high k-value or a low k-value when referring respectively to dielectric materials having high and low k-values.

The terms "higher k-value" and "lower k-value" as used herein refer to the relative k-values when compared to other materials having a specific k-value.

The term "monolayer" as used herein refers to a single layer of atoms or molecules deposited on a surface which can be closely packed. The term "a few monolayers" refers to a few of these monolayers deposited together on the surface.

Referring initially to FIG. 1, a non-volatile memory (NVM) device 100 in accordance with one embodiment of the present disclosure is shown. The NVM device 100 comprises a semiconductor substrate 105 on which is formed a tunnel dielectric layer 110. A floating gate (FG) structure 120 is formed on the tunnel dielectric layer 110. The FG structure 120 comprises a hybrid floating gate structure including a bottom layer 125 and a top metal layer 130. As used herein, a hybrid floating gate structure refers to a floating gate structure that has a stacked structure comprising a semiconductor material and a metal or a metallic material. A first interfacial layer 140 is formed on the top metal layer 130 of the FG structure 120. The first interfacial layer 140 comprises a first high-k dielectric material having a predetermined k value and a predetermined thickness. An inter-gate dielectric (IGD) structure 150 is formed on the first interfacial layer 140. The IGD structure 150 comprises a first layer 155 formed on the first interfacial layer 140, a second layer 160 formed on the first layer 155, and a third layer 165 formed on top of the second layer 155. The second layer 155 is effectively sandwiched between the first layer 155 and the third layer 165. The second layer 160 comprises a dielectric material having a lower k-value than the dielectric material of the first and third layers 155, 165, for example, a layer of $SiO_2$. A control gate (CG) structure 170 is formed on the IGD structure 150.

The first interfacial layer 140 and the layers 155, 160, 165 in the IGD structure 150 are carefully chosen with respect to their k-values and thicknesses to provide appropriate band gaps for the various layers of the NVM device 100. In some embodiments, at least for some of the various layers have k-values that inversely correlate to the band gaps such that higher the k-value, smaller the band gap. In some other embodiments, such correlations do not exist.

In addition, in some embodiments, the first interfacial layer 140 is chosen to be electrically transparent so as not to affect the program saturation of the NVM device 100. In this respect, the thickness of the first interfacial layer 140 can be chosen to not exceed a few monolayers and its k-value is chosen to be high, that is, greater than 3.9.

In some embodiments, electronic properties of the first interfacial layer 140 can be tuned by carefully tuning the deposition condition of the first (high-k) layer 155 of the IGD structure 150. For example, if the first layer 155 of the IGD structure 150 comprises HfAlO, the atomic layer deposition (ALD) process may starts (and/or end) with $Al_2O_3$ cycles in order to form the first interfacial layer. Due to this specific process, no defective interfacial layer is promoted due to the presence of hafnium oxide ($HfO_2$) and a good quality high-k interfacial layer is formed.

In one embodiment, $Al_2O_3$ promotes the formation of an aluminium-titanium-oxide (Al—Ti—O) interfacial layer due to inter-diffusion of titanium (Ti) into the $Al_2O_3$. On the other hand, $HfO_2$ tends to have an enhanced oxygen in-diffusion into titanium nitride (TiN) as compared to $Al_2O_3$. This oxygen in-diffusion goes together with a clear out-diffusion of nitrogen (N) into the $HfO_2$.

Because the FG structure 120 comprises a top metal layer 130, some embodiments of the present disclosure advantageously does not include a low-k interfacial layer, for example, comprising $SiO_2$, at an FG/IGD interface between the FG structure 120 and the IGD structure 150. In addition, in some embodiments where the CG structure 170 comprises a metal, no low-k interfacial layer is formed at a CG/IGD interface between the CG structure 170 and IGD structure 150. Having low-k interfacial layers at either or both of the FG/IGD interface or the CG/IGD interface is advantageous for improving the device performance, for example, the program saturation performance discussed above.

In some embodiments, in operation, the potential drop over the interfacial layer 140 between the FG structure 120 and the first layer 155 of the IGD structure 150 is smaller than 0.5 eV. This can be achieved, for example, by increasing the metal work function of the top metal layer 130 of the FG structure 120.

In some embodiments, the first interfacial layer 140 and the first layer 155 of the IGD structure 150 are formed in a single in situ process. For example, the first interfacial layer 140 may be formed during or by at least a first cycle of the ALD process for forming the first layer 155 of the IGD structure 150. In these embodiments, the first interfacial layer 140 is thus formed in situ within the same ALD chamber while forming the IGD structure 150.

Alternatively, in some other embodiments, the first interfacial layer 140 may be formed before the formation of the IGD structure. In these embodiments, the first interfacial layer 140 is thus formed in a separate or other deposition process than the deposition process for the IGD structure 150.

As described above, the IGD structure 150 comprises a stack of high-k/low-k/high-k layers which means that a high-k layer is present at sides of both the FG structure 120 and the CG structure 170. It will be appreciated that the third high-k layer 165 formed adjacent to the CG structure improves erase saturation characteristics of the NVM device 100. It will be further appreciated that the first high-k layer 155 formed adjacent to the FG structure 120, or formed on the first interfacial layer 140, improves program saturation characteristics of the NVM device 100.

The combination of a first interfacial layer 140 formed between the FG structure 120 and the IGD structure 150 may be advantageous for enabling planar non-volatile memory devices, and, as such, to extend these devices beyond the 10 nm technology node. An area factor (AF) equal to 1 is targeted for planar non-volatile memory devices which comprise a hybrid floating gate (HFG) with no low-k layer in contact with the FG structure 120. According to a further embodiment of the present disclosure, the non-volatile memory device may further comprise a second interfacial layer. Such a device is shown in FIG. 2.

Figure 2:
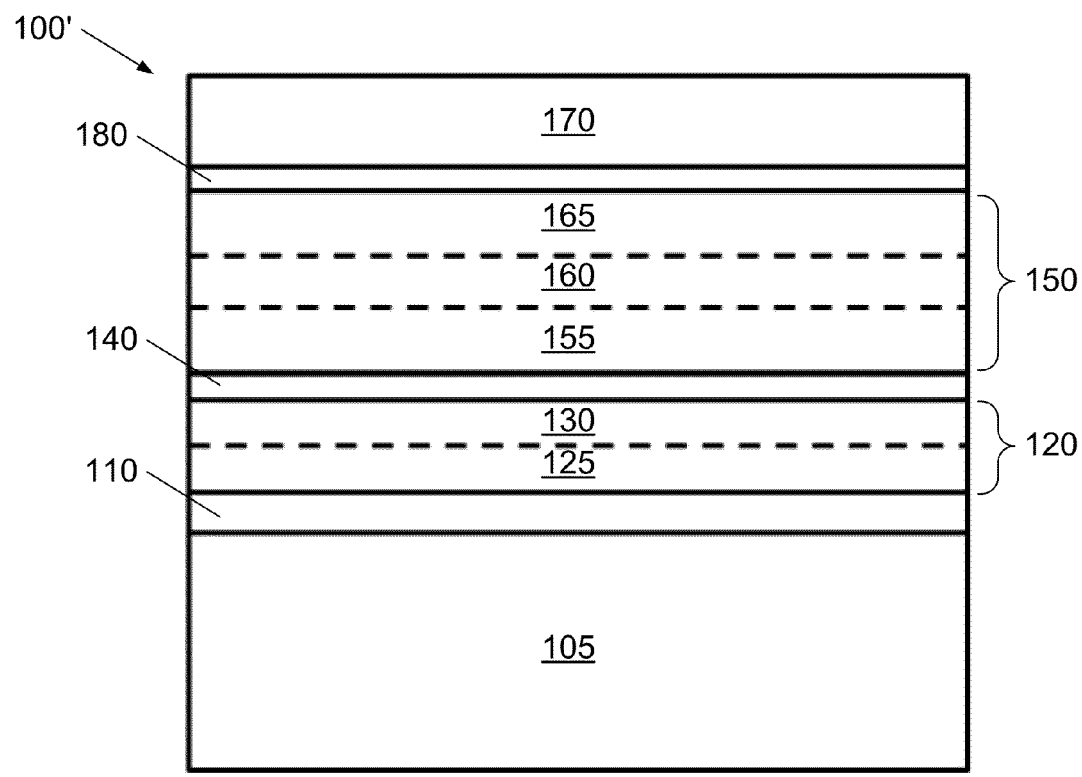
FIG. 2 is a schematic cross-sectional illustration of a non-volatile semiconductor device including an inter-gate dielectric structure and a first interfacial layer formed between the floating gate and the inter-gate dielectric stack, and further including a second interfacial layer formed between the inter-gate dielectric stack and the control gate.

In FIG. 2, a non-volatile memory (NVM) device 100' is shown which is similar to the NVM device 100 shown in FIG. 1, except that the NVM device 100' additionally includes a second interfacial layer 180 formed between the top or third layer 165 of the IGD structure 150 and the CG structure 170. The second interfacial layer 180 comprises a second high-k dielectric material with a second predetermined k value and a second predetermined thickness.

As described above, in various embodiments of the present disclosure, the k-value and the thickness of each of the first and second interfacial layers 140 and 180 selected such that the first and second predetermined k-values are chosen to higher than the k-values of the corresponding adjacent neighbouring layers of the IGD structure 150. In other words, the k-value of the first interfacial layer 140 is selected to be higher than the k-value of the first layer 155 of the IGD structure 150, and the k-value of the second interfacial layer 180 is selected to be higher than the k-value of the third layer 165 of the IGD structure 150.

As described above, in some embodiments, the k-values of at least some of the different layers (both interfacial layers 140. 180 and IGD structure layers 165, 160, 155) inversely correlate to the band gaps of these layers, such that higher the k-value, smaller the band gap.

In addition, in some embodiments, at least one or both of the first and second interfacial layers 140 and 180 are chosen to be electrically transparent so as not to affect the program saturation of the NVM device 100' of which they form a part. Therefore, the thicknesses of the at least one or both of the interfacial layers 140 and 180 are chosen to not exceed a few monolayers and the k-values of the at least one or both of the interfacial layers are chosen to be high, e.g., greater than 3.9.

In some embodiments, similar to as described above with respect to formation of the first interfacial layer 140, the second interfacial layer 180 and the third layer 165 of the IGD structure are formed in a single in situ process. For example, the second interfacial layer 180 may be formed during or by at least a last cycle of the ALD process for forming the third layer 165 of the IGD structure 150. In these embodiments, the second interfacial layer 180 is thus formed in-situ within the ALD chamber while forming the IGD structure 150.

In some embodiments of the fabrication process of the NVM device 100' of FIG. 2, at least one or both of the interfacial layers 140 and 180 may therefore be formed in a single in situ process with the ALD process for forming one or more layers of the IGD structure 150. In embodiments where both of the interfacial layers 140 and 180 are formed in a single process, the first interfacial layer 140 is formed in a single in situ process with the first layer 155, and the second interfacial layer 180 is formed in a single in situ process with the third layer 165. Thus, in some embodiments, an entire stack including the first and second interfacial layers 140 and 180 and the first, second and third layers 155, 160 and 165 of the IGD structure 150 can be formed in situ in a single process in a single ALD chamber. This has the advantage that the conditions can be carefully controlled without having to remove the NVM device from the ALD chamber.

Alternatively, in some other embodiments, the first and/or second interfacial layers 140 and 180 may be formed in separate or other deposition processes. In these embodiments, the interfacial layers 140, 180 may be formed before and/or after the formation of the IGD structure 150.

Figure 3:
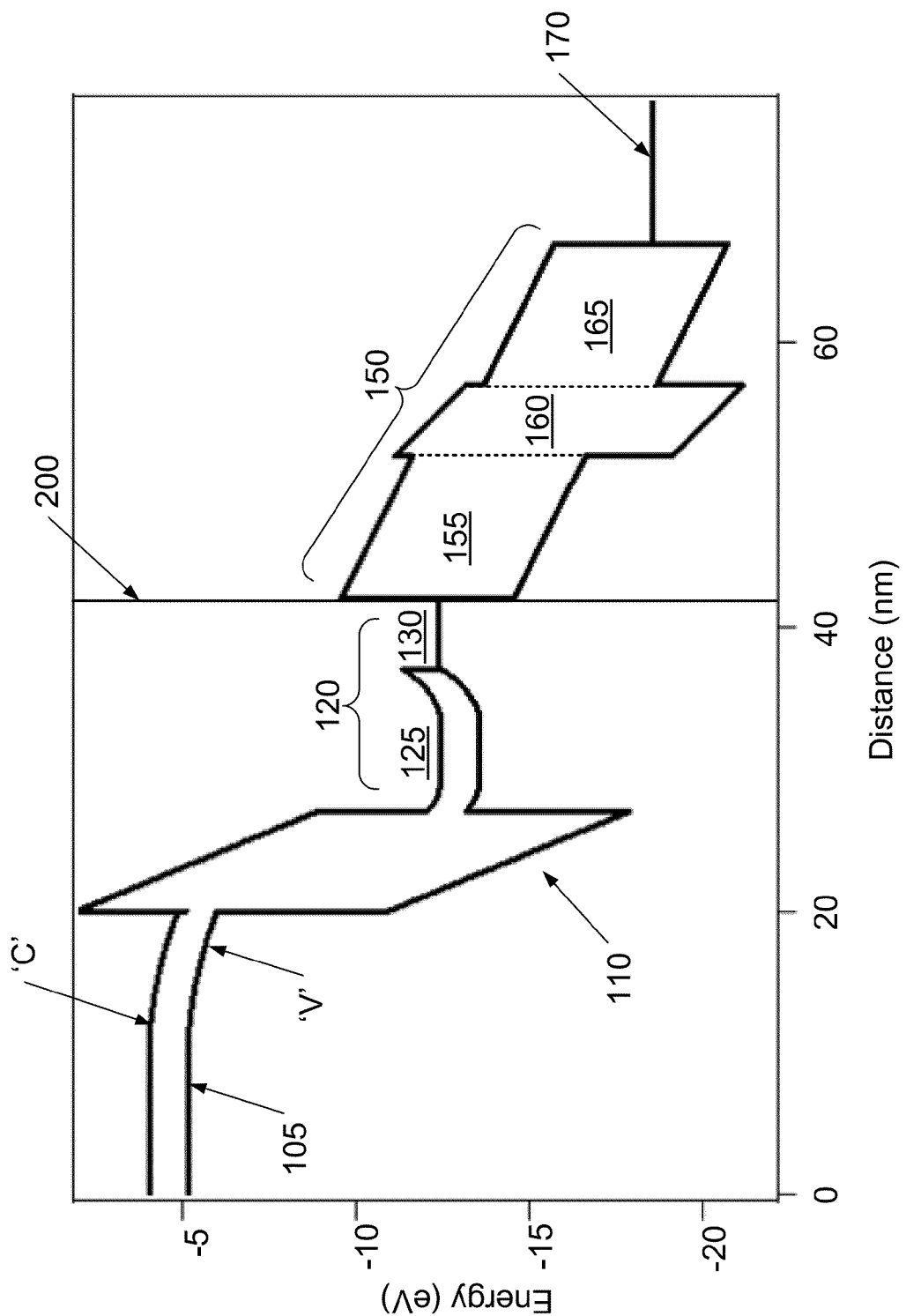
FIG. 3 is a schematic representation of an energy band diagram for a non-volatile memory device including an inter-gate dielectric stack comprising three layers, according to some embodiments.
Figure 4:
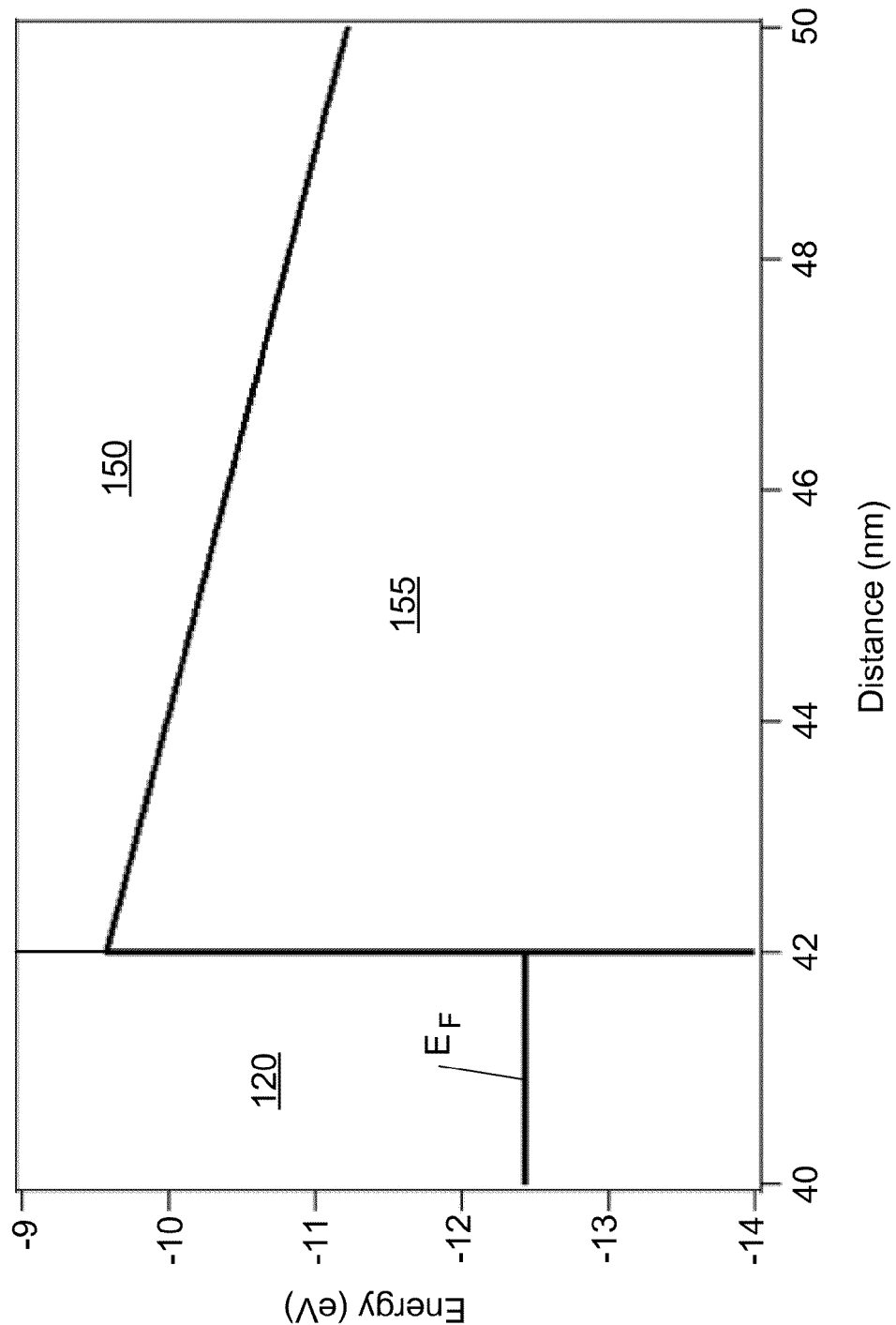
FIG. 4 is an enlarged view of the energy band diagram of FIG. 3 corresponding to an interfacial region between the floating gate structure and the inter-gate dielectric stack.

FIG. 3 illustrates a schematic representation of the energy band diagram for a NVM device with no interfacial layers, but having a three-layer IGD structure as described above, taken through a bottom-up cross-section of the device, that is, from the substrate to the control gate. Components which correspond to layers of the NVM devices 100, 100' described above are referenced the same. The lower line, 'V', corresponds to the valence band, Ev, and is indicative of the potential energy profile for holes within the NVM device. The upper line, 'C', corresponds to the conduction band, Ec, and is indicative of the potential energy profile for electrons. As shown, there is an interface region 200 between the FG structure 120 and the IGD structure 150. An enlarged view of line 'C' within the interface region 200 is shown in FIG. 4. In FIG. 4 and throughout the specification, $E_F$ represents the work function of the top metal layer 130 of the floating gate structure 120. This shows an ideal theoretical situation as there is no potential drop at the interface region 200 between the IGD structure 150 and the FG structure 120, since there is no interfacial layer. However, in practice, such an arrangement is difficult to achieve, due to the presence of an interfacial layer resulting from a non-ideal interface.

Figure 5:
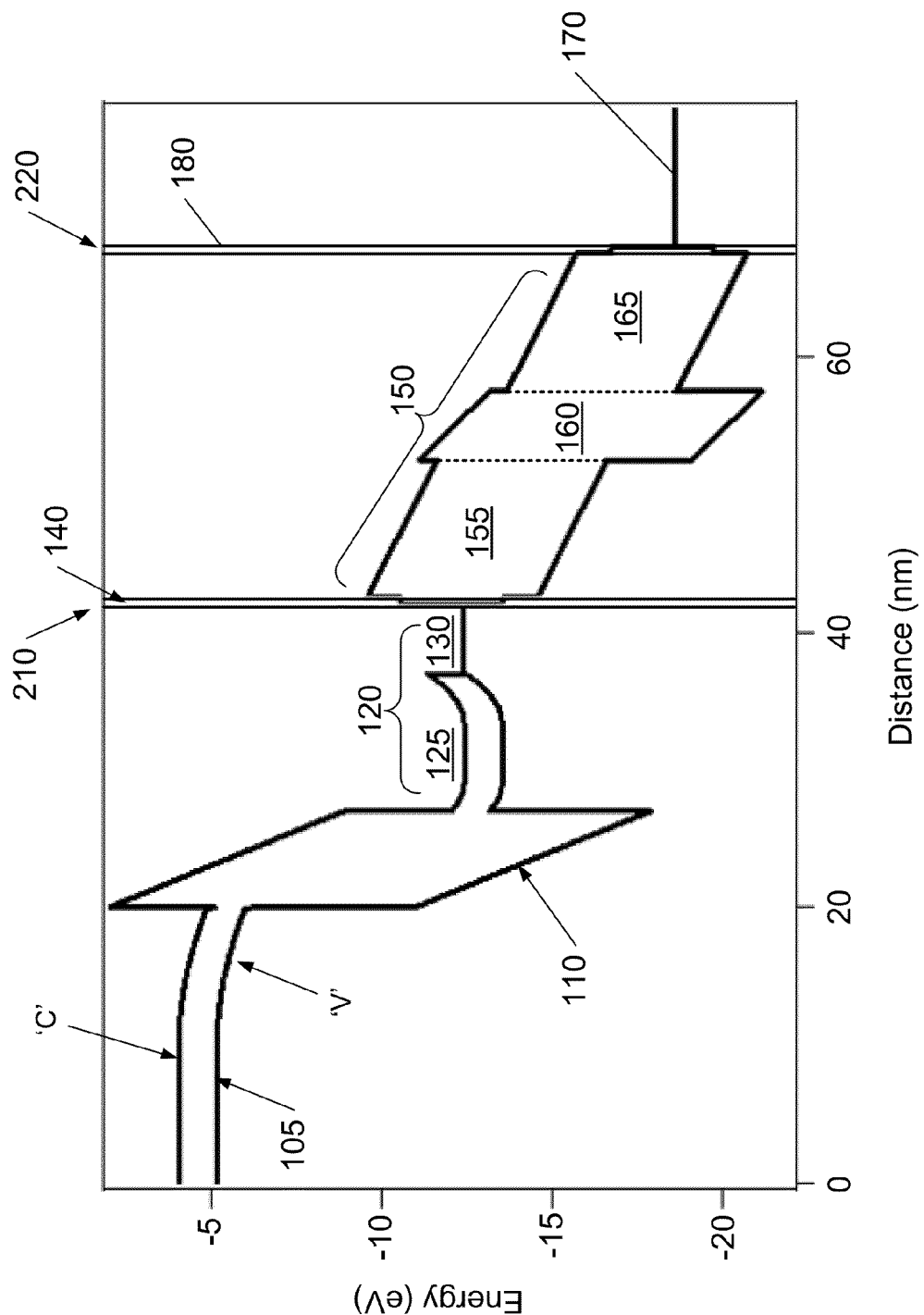
FIG. 5 is a schematic representation of an energy band diagram for a non-volatile memory device including an inter-gate dielectric stack and first and second interfacial layers having a high-k material, according to some embodiments.
Figure 6:
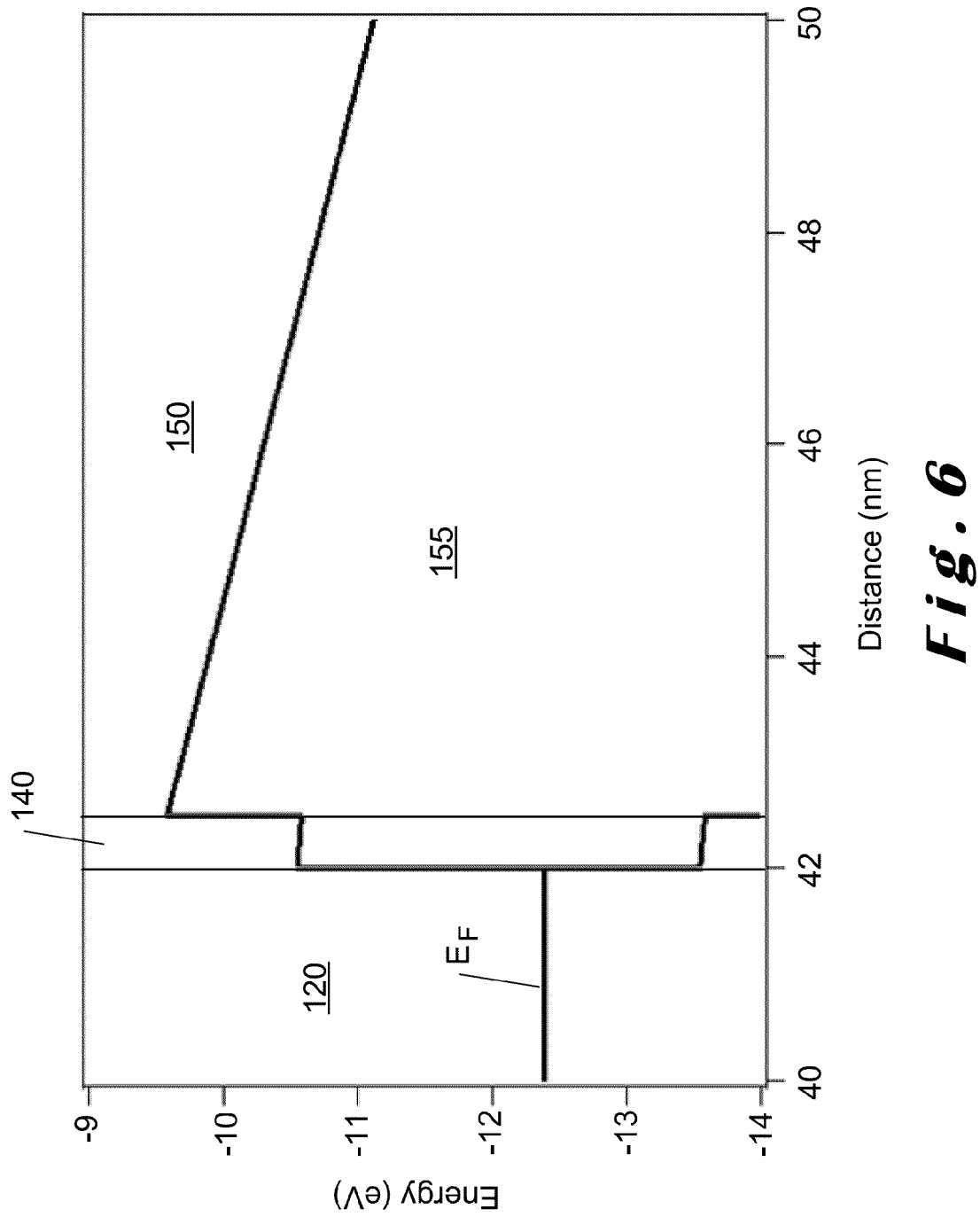
FIG. 6 is an enlarged view of the energy band diagram of FIG. 5 corresponding to an interfacial region between the floating gate structure and the inter-gate dielectric structure.

FIG. 5 is similar to FIG. 3 but illustrates an energy band diagram for a non-volatile memory device with a first interfacial layer 140 and a second interfacial layer 180 according to the embodiment shown in FIG. 2. Similar to corresponding designations in FIG. 3, lines 'V' and 'C' respectively indicate the valence band, Ev, and the conduction band, Ec, and their respective energy profiles for holes and for electrons. A first interface region 210 between the FG structure 120 and the IGD structure 150 includes the first interfacial layer 140 and a second interface region 220 between the IGD structure 150 and the CG structure 170 includes the second interfacial layer 180. An enlarged view of line 'C' in the first interface region 210 is shown in FIG. 6. Similarly, an enlarged view of line 'C' in the second interface region 220 is shown in FIG. 7.

From FIG. 6, it is clearly seen that a small voltage drop between the FG structure 120 and the IGD structure 150 can obtained by using a high-k interfacial dielectric layer 140 between the FG structure 120 and the IGD structure 150. Advantageously, the voltage drop across the interfacial layer 140 can be kept below about 0.5 eV, which can be achieved, for example, when using a high-k interfacial dielectric layer with a k-value higher than that of the first layer 155 of the IGD structure 150 in between the FG structure 120 and the IGD structure 150.

It will be appreciated that the interface region 210 shown in FIGS. 5 and 6 are also applicable to the embodiment of the present disclosure shown in FIG. 1.

Figure 7:
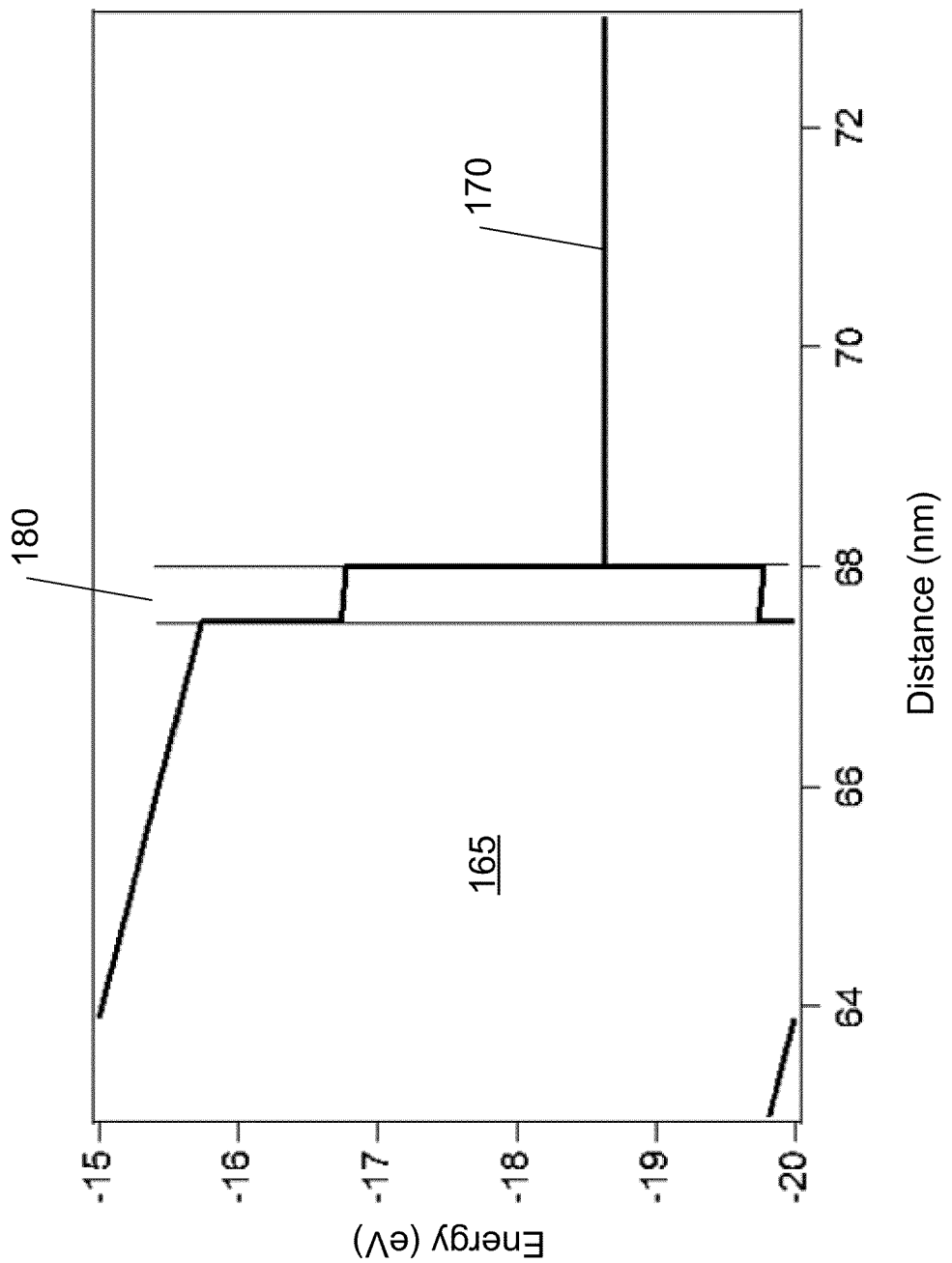
FIG. 7 is an enlarged view of the energy band diagram of FIG. 5 corresponding to an interfacial region between the inter-gate dielectric structure and the control gate structure.

FIG. 7 also shows that a small voltage drop between the IGD structure 150 and the CG structure 170 can be obtained by using a high-k interfacial dielectric layer 180 between the IGD structure 150 and the CG structure 170.

Figure 8:
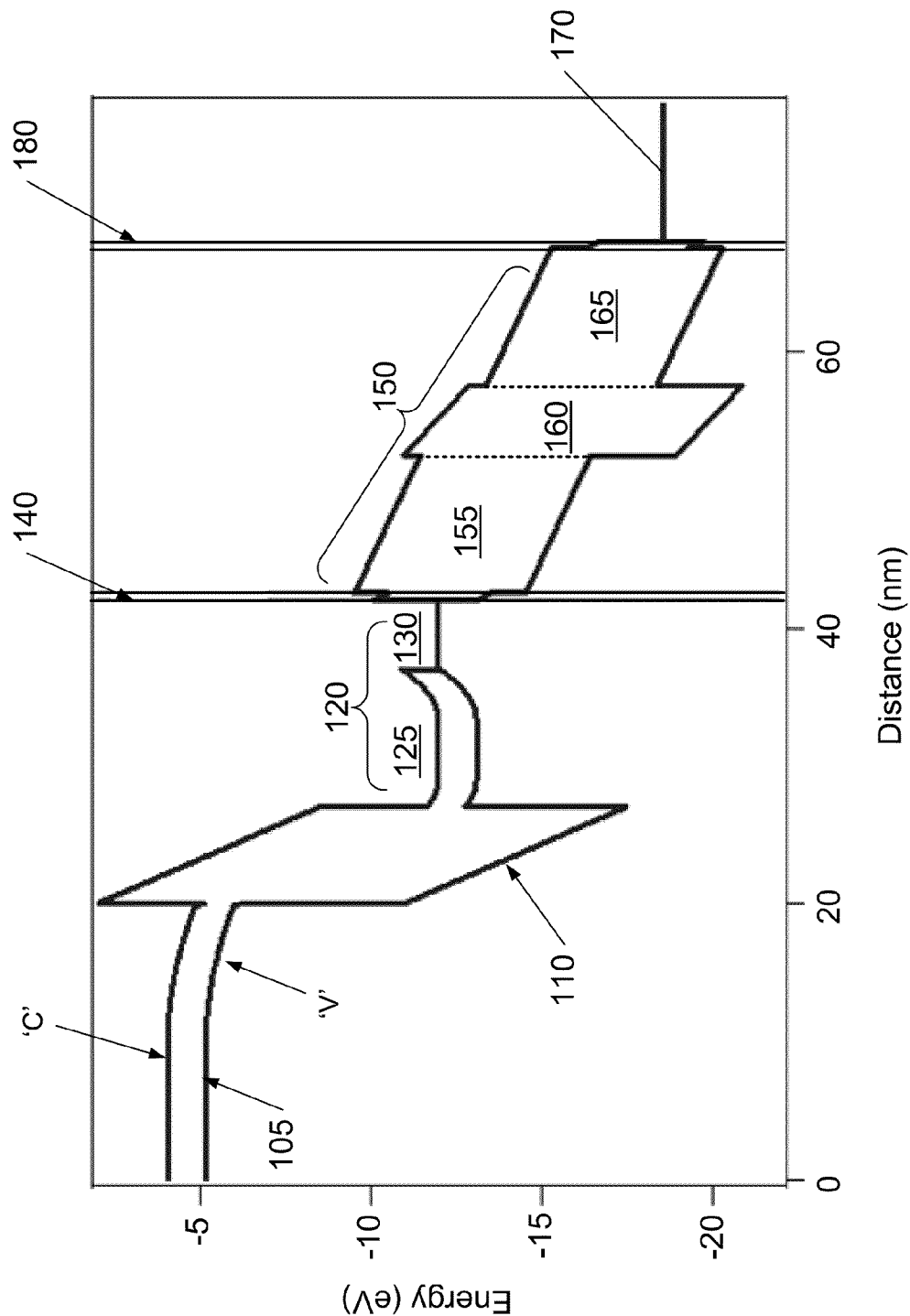
FIG. 8 is a schematic representation of an energy band diagram for a non-volatile memory device including an inter-gate dielectric stack and first and second interfacial layers having a low-k material, according to some embodiments.

FIG. 8 is similar to FIG. 5 but illustrates a schematic representation of the energy band diagram for a NVM device with a FG structure 120 but with a lower-k interfacial layer 140, such as, for example, $SiO_2$ (where k=3.9), as a comparative example. As before, the potential energy profiles are shown for the holes (line 'V') and the electrons (line 'C'). Interface regions 210' and 220' are shown with an enlarged view of interface region 210' being shown in FIG. 9. Here, it can be seen that the energy barrier of the IGD structure 150 is strongly reduced when compared to FIGS. 5 and 6. This is because of the voltage/energy drop across the interfacial layer 140. This is not preferred, as such a large voltage drop across the interfacial layer 140 can cause a program saturation to be reached at lower programming voltages under some circumstances, which can result in a smaller programming window compared to the programming window that can be reached by a NVM device having a higher-k interfacial layer 140.

For all energy band diagrams as shown in FIGS. 3 to 9, the following values are used: $E_{td}$ referring to the electric field in the tunnel dielectric layer 110 has a range typically between 8 MV/cm and 15 MV/cm, where MV stands for megavolts. The physical thickness of the first interfacial layer t(IL)=0.5 nm. The relative permittivity of the interfacial layer k(IL)=50.

In one embodiment of the present disclosure, at least one of the following is selected such that the voltage potential drop over each of the interfacial layers 140, 180 is lower than 0.5 eV: the first predetermined thickness of the first interfacial layer 140; the second predetermined thickness of the second interfacial layer 180; the first high k-value of the high-k dielectric material of the first interfacial layer 140; the second high k-value of the high-k dielectric material of the second interfacial layer 180.

In addition, the first and/or second predetermined thickness of the respective first and/or second interfacial layer is less than 1 nm. More preferably, each interfacial layer 140, 180 comprises only a few monolayers, typically having a thickness in the range from about 0.1 nm to 0.7 nm.

In another embodiment of the present disclosure, the first and second interfacial layers 140, 180 comprise a different high-k dielectric material to that of respective ones of the first and third layers 155, 165 of the IGD structure 150.

In some embodiments, the first and second interfacial layers 140, 180 comprise a material chosen from the following materials: $Al_2O_3$, $HfO_2$, $HfAlO_x$, zirconium oxide ($ZrO_2$), barium oxide (BaO), titanium dioxide ($TiO_2$), titanium aluminium oxide (TiAlO), scandium oxide ($Sc_2O_3$), gadolinium oxide ($Gd_2O_3$), yttrium oxide ($Y_2O_3$), lanthanum oxide ($La_2O_3$), all rare earth oxides, ((Ba, Sr), (Ti, Zr))O, and mixtures thereof, to name a few.

In some embodiments one or both of the interfacial layers 140 and 180 may comprise one or more metal elements from an adjacent metal layer. For example, the first interfacial layer 140 may comprise one or more metal elements included in the second metal layer 130 of the FG structure 120, and the second interfacial layer 180 may comprise one or more metal elements included in the CG structure 170.

Referring back to FIGS. 3, 5 and 8, the floating gate structure 120 comprises a hybrid gloating gate structure including a bottom layer 125 and a top layer 130. In the illustrated embodiment in FIG. 5, the bottom layer 125 of the hybrid floating gate structure 120 comprises silicon doped with an n-type dopant, and the top layer 130 of the floating gate structure 120 comprises a metal. The metallic material has comprising sufficiently high work function such that under a programming condition shown, the conduction band of the semiconductor material bends upwards towards the metallic material. However, other embodiments are possible. For example, the bottom layer 125 may be doped with a p-type dopant, and the top layer 130 of the floating gate structure 120 may have a lower work function such that under a similar programming condition, the conduction band of the semiconductor material bends downwards towards the metallic material. Examples of metals that can be included in the top layer 130 of the FG structure 120 include a material chosen from, for example, TiN, tantalum nitride (TaN), ruthenium (Ru), ruthenium oxide ($RuO_x$), ruthenium tantalum ($Ru_xTa_{1-x}$), titanium tantalum aluminium nitride ((Ti, Ta)AlN), titanium aluminium hafnium nitride ((Ti, Al, Hf)N), platinum (Pt), iridium (Jr), iridium oxide ($IrO_x$), tungsten (W), hafnium carbide (HfC), tantalum carbide (TaC), aluminium carbide (AlC), niobium nitride (NbN), molybdenum (Mo), molybdenum oxide ($MoO_x$), molybdenum oxide nitride ($MoO_xN_y$), palladium (Pd), cobalt (Co), and nickel (Ni), or a mixture thereof.

An exemplary NVM device according to the present disclosure comprises a tunnel dielectric layer 110 which can comprise $SiO_2$ formed on a Si semiconductor substrate 105. An FG structure 120, having at least a top metal layer 130, which can include a TiN metal layer, is formed on the tunnel dielectric layer 110. A first interfacial layer 140, which can include aluminum oxide ($Al_xO_y$), is formed on the top metal layer 130 of the FG structure 120. An IGD structure 150 comprising at least a first layer 155, which can include HfAlO, a third layer 165, which can include HfAlO, and a second layer 160, which can include one of $SiO_2$ or $Al_2O_3$, and sandwiched between the first layer 155 (e.g., HfAlO) and the third layer 165 (e.g., HfAlO), is formed on the interfacial first layer 140. The IGD structure 150 so formed can comprise one of HOH, HAH or HaH. A CG structure 170 is formed on the IGD structure 150. The first interfacial layer 140 has a higher k-value than that of first layer 155 (e.g., a HfAlO layer) to which it is adjacent.

As described above, in another exemplary NVM device, a second interfacial layer 180 which can include $Al_xO_y$ is formed between the third layer 165, which can include HfAlO, of the IGD structure 150, and the CG structure 170.

The second interfacial layer 180 has a higher k-value than that of the third layer 165 (e.g., a HfAlO layer) to which it is adjacent.

The present disclosure also relates to an exemplary method for forming a NVM device. The method comprises providing a tunnel dielectric layer 110 on a semiconductor substrate 105; providing a FG structure 120, having at least a top metal layer 130 (e.g., TiN), on the tunnel dielectric layer 110; providing a first interfacial layer 140 on the top metal layer 130 of the FG structure 120, the first interfacial layer 140 comprising a predetermined first thickness and a high-k dielectric material with a predetermined first k-value; providing an IGD structure 150 on the first interfacial layer 140, the IGD structure 150 comprising at least a first layer 155 on the first interfacial layer 140, a third layer 165 and a second layer 160 being sandwiched between the first layer 155 and the third layer 165; the second layer 160 comprising a dielectric material with a lower k-value than the dielectric material of the first and the third layers 155 and 165; and providing a CG structure 170 on the IGD structure 150.

As described above, a second interfacial layer 180 may also be provided between the third layer 165 of the IGD structure 150 and the CG structure 170.

In the specific example where a TiN metal layer is used for the top metal layer 130 of the FG structure 120, the first interfacial layer 140 formed between the metal layer 130 and the first layer 155 of the IGD structure 150 may comprise a Ti—O based layer. $TiO_2$ may have a k-value greater than 80 (depending on the polymorph). However, due to the reaction/intermixing with the dielectric elements of the first layer of the IGD structure, the interfacial layer may comprise some defects which reduce its k-value. However, the k-value will not become less than the k-value of the first layer of the IGD structure.

Although TiN has been described above, it will be appreciated that other metals may be used for the metal layer.

In one example, the IGD structure comprises three film layers which were deposited by ALD in a capacitor flow. On an 8.5 nm in-situ steam generated (ISSG) $SiO_2$ tunnel oxide, a FG structure 120 comprising a hybrid floating gate (HFG, i.e., a FG structure with a top metal layer 130, e.g., a lower layer of 2 nm Si with a top layer of 5 nm TiN) is formed, e.g., deposited, by physical vapour deposition (PVD) and patterned afterwards. After formation of the IGD structure 150 and an anneal, the CG structure 170 was formed, which includes 10 nm PVD-TiN followed by 75 nm poly-Si deposited at 720° C. and activated at 850° C., which determines the lowest thermal budget. With an $Al_2O_3$ IGD structure, best results were obtained after a 1000° C., 1 min post deposition anneal (PDA) in nitrogen ($N_2$). This is used as a reference IGD structure, and compared to various high-k IGD single layers or stacks: $HfO_2$, HfAlO, $Al_2O_3$—HfAlO—$Al_2O_3$ (AHA), HfAlO—$Al_2O_3$—HfAlO (HaH, HAH), HfAlO—$SiO_2$—HfAlO (HOH).

Figure 9:
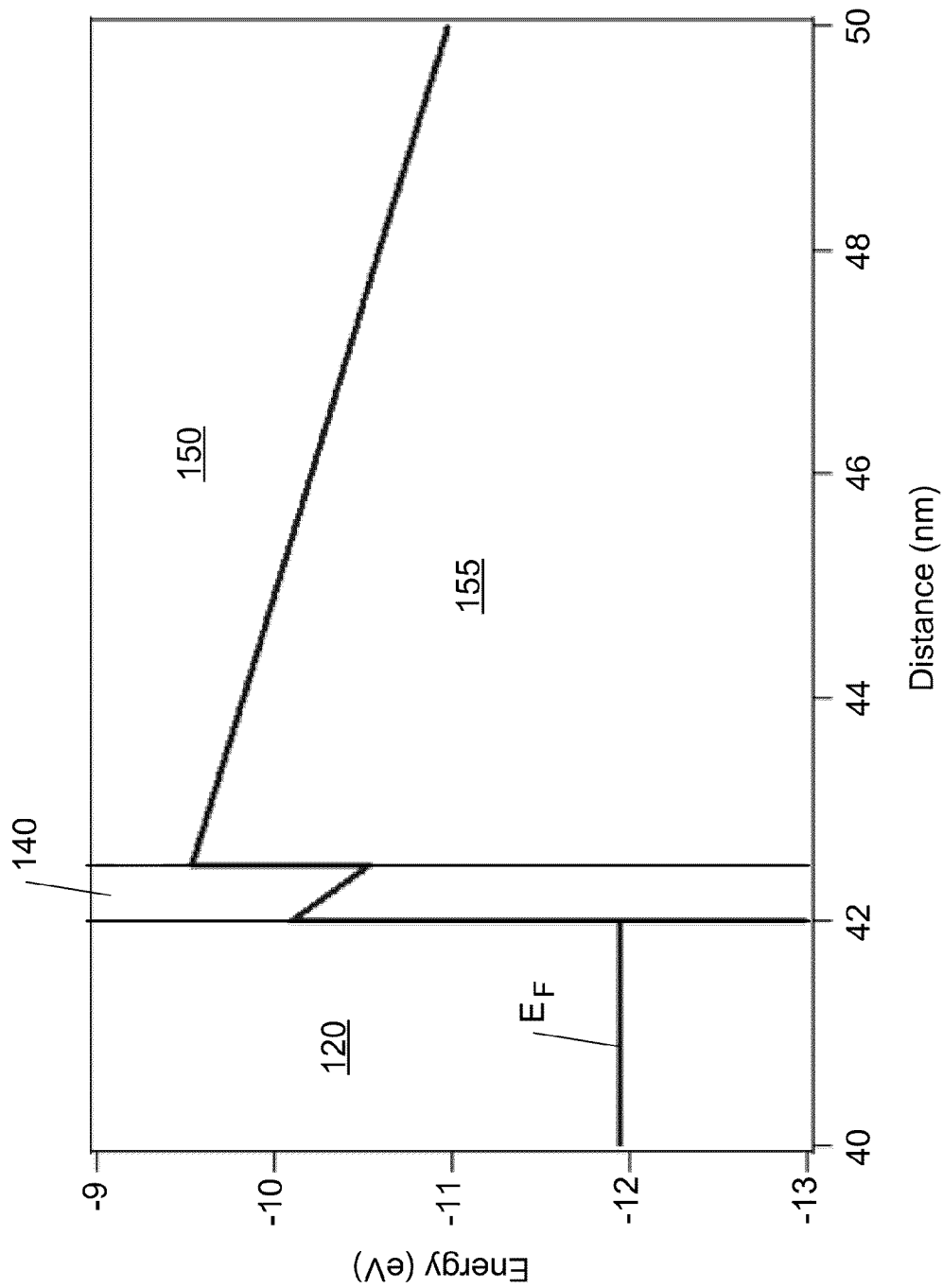
FIG. 9 is an enlarged view of the energy band diagram of FIG. 8 corresponding to an interfacial region between the floating gate structure and the inter-gate dielectric structure.

Different high-k dielectric materials, for example, $Al_2O_3$, $HfO_2$, HfAlO single layers, used as an IGD structure have different behaviours. The program and erase characteristics were evaluated by measuring the flat-band voltage (Vfb) shift (Vfb-Vfb0), after application of a positive (negative) pulse with increasing amplitude. This procedure is referred as incremental step pulse programming (ISPP) or incremental step pulse erasing (ISPE). The pulse duration was 100 μs for programming and 1 ms for erasing. As long as the (Vfb-Vfb0) is caused by charge injected into the HFG structure with a negligible current passing through the IGD structure, the characteristics have a 1:1 relationship as shown by the ISPP and ISPE slopes as shown in FIG. 9.

Figure 10:
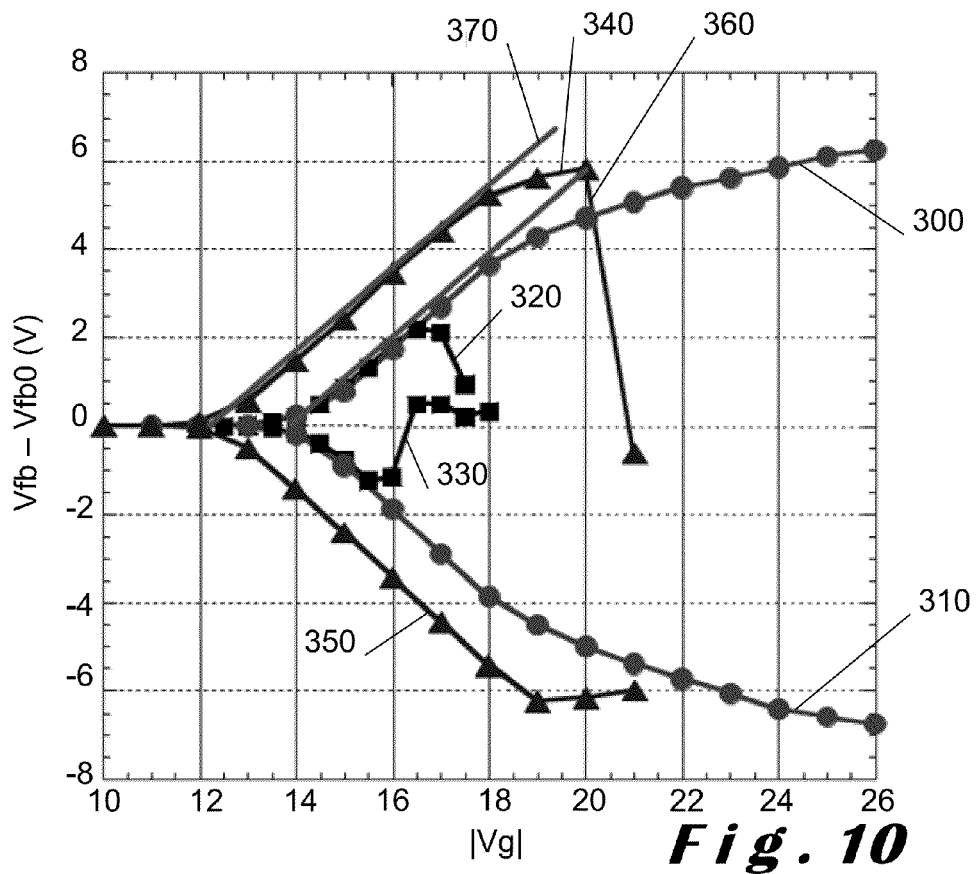
FIG. 10 is a graph illustrating program/erase characteristics of capacitors with silicon/titanium nitride (Si/TiN) hybrid floating gate and inter-gate dielectric structures comprising aluminium oxide ($Al_2O_3$), hafnium oxide ($HfO_2$) or hafnium aluminate (HfAlO), according to some embodiments.

In FIG. 10, the results for the $Al_2O_3$, $HfO_2$ and HfAlO layers are represented by solid circles, squares and triangles. These results are indicated as lines 300, 310 for $Al_2O_3$, as lines 320, 330 for $HfO_2$, and as lines 340, 350 for HfAlO. The ISPP slope for $Al_2O_3$ and $HfO_2$ is indicated by line 360 and the ISPP slope for HfAlO is indicated as line 370. Although not shown, it will readily be appreciated that similar slopes can be drawn for the ISPE.

At larger Vfb shifts however, the current through the IGD structure starts to become significant, leading to charge trapping in the IGD structure. This corresponds to a saturation regime where the Vfb shift increases more slowly, with the ISPP or ISPE slope becoming lower than 1:1. Since charge is injected in the IGD structure in this regime, this is expected to cause reliability issues, so that the useful memory window should be considered as the maximum Vfb shift before the slope flattens.

In the case of a single layer $Al_2O_3$ IGD structure (solid circles), the memory window is therefore ±4V as shown in FIG. 10. This is too low for multi-level operation which would require as much as 12V to take into account reliability and disturb margins to keep the programmed levels distributions well separated.

In the case of a single layer HfAlO IGD structure (solid triangles), the program/erase voltages are lower due to the HfAlO having a higher k-value, typically around 19. The memory window is also slightly better, ±5V before saturation.

In the case of a single layer $HfO_2$ IGD structure (solid squares), saturation occurs very early and is quickly followed by breakdown. This is due to huge leakage through the layer due to a poor interface with the TiN layer in HFG structure, and to the microcrystalline (monoclinic) structure, both enhanced by the high temperature activation annealing at 850° C. Such a thermal budget is difficult to avoid in view of cell integration, which compromises the use of $HfO_2$ alone in IGD structure or stack.

Showing a better interface with TiN, lower crystallinity and a high k-value, HfAlO appears to be suitable for the IGD structure but the window is still limited. The window could be further enlarged by increasing the equivalent oxide thickness (EOT) at the expense of higher voltages to a similar value as $Al_2O_3$, but that would also lead to impractically thick IGD structure which is detrimental for cell dimensions scaling.

A solution for limiting the IGD leakage and thus delaying the saturation regime without too large IGD thickness is by using a suitable combination of high-k/low-k materials. Considering the poor characteristics of $HfO_2$, HfAlO was selected a as high k-layer (~19), and $Al_2O_3$ as low k-layer (~9). Fowler-Nordheim Tunnelling (FNT) simulations were used to compare the expected leakage characteristics in three layer IGD structures for both low-k/high-k/low-k and high-k/low-k/high-k configurations as shown in FIGS. 11 and 12 respectively.

Figure 11:
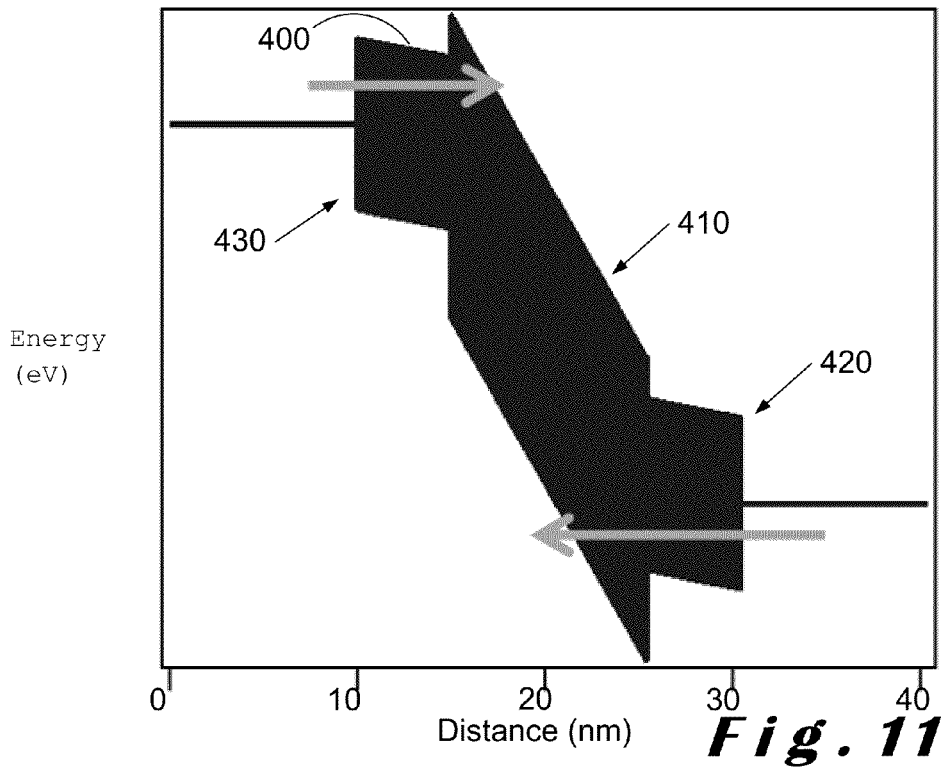
FIG. 11 is a schematic energy band diagram for an inter-gate dielectric structure having a high-k material during a programming operation, according to some embodiments.
Figure 12:
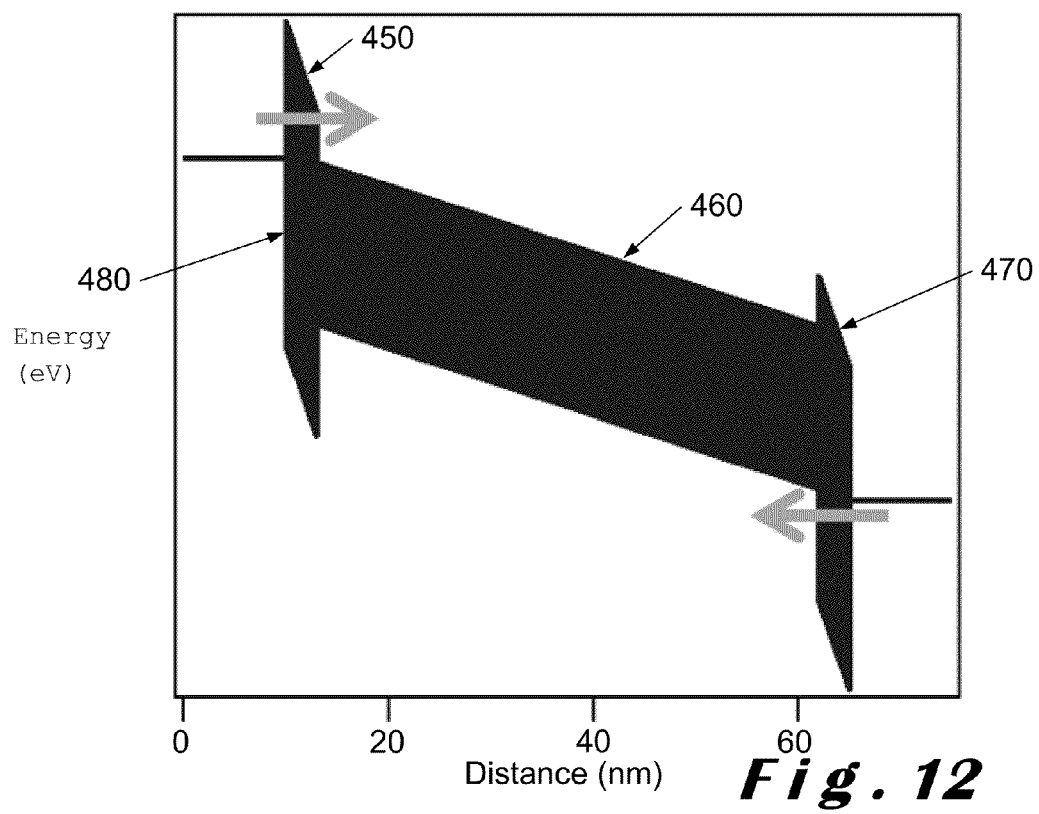
FIG. 12 is a schematic energy band diagram for an inter-gate dielectric structure having a low-k material during a programming operation, according to some embodiments.

In FIGS. 11 and 12, simulated energy band diagrams are shown for a cross-section through the IGD structure for the two configurations. In FIG. 11, areas of the high-k/low-k/high-k combination are indicated by 400, 410, 420 respectively, and, in FIG. 12, areas of the low-k/high-k/low-k combination are indicated by 450, 460, 470. The simulated energy/voltage characteristics through the IGD structures or stacks indicate that having the high-k layer (HfAlO) at the injecting interface, indicated as 430 in FIG. 11, decreases the leakage current. This is due to the increased tunnelling distance. On the other hand, the low-k, larger band gap layer ($Al_2O_3$) placed at the injecting interface, indicated as 480 in FIG. 12, shows increased injecting current when this layer is too thin, because of the variot effect promoting injection through the IGD structure (as described an article entitled "VARIOT: a novel multilayer tunnel barrier concept for low-voltage nonvolatile memory devices", IEEE Electron Device Letters, Vol. 24, Issue 2, pages 99 to 101, February 2003, by B. Govoreanu et al.). In this case, the first and last $Al_2O_3$ layers need to be sufficiently thick, but even then, only a small benefit was expected when compared to single layer $Al_2O_3$ IGD structure.

Figure 13:
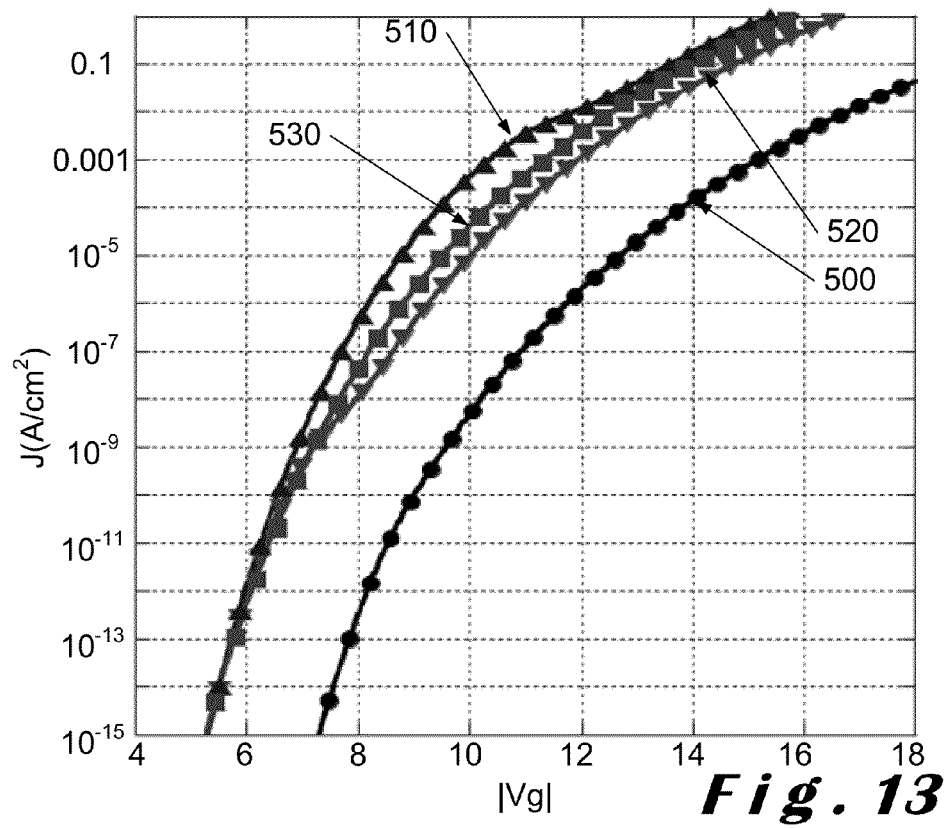
FIG. 13 is a graph of Fowler-Nordheim tunnelling current simulations through inter-gate dielectric stacks with 6.5 nm total equivalent oxide thickness sandwiched between titanium nitride electrodes, according to some embodiments.

FIG. 13 illustrates the results of current simulation through IGD structures with 6.5 nm total EOT sandwiched between TiN electrodes. The simulation parameters were as follows: HfAlO layer had a k-value of 19 with a barrier to TiN of 2.45 eV and the $Al_2O_3$ had a k-value of 9 with a barrier to TiN of 2.85 eV. Three three-layer IGD structures, namely, HaH with layer thicknesses of 10 nm/5 nm/10 nm as indicated by line 500 (solid circles), AHa with layer thicknesses of 5 nm/10 nm/5 nm as indicated by line 510 (solid triangles) and AHa with layer thicknesses of 3 nm/18 nm/3 nm as indicated by line 520 (inverted solid triangles), were compared to a single layer AlO 15 nm structure as indicated by line 530 (solid squares).

Various Stacks of $HfAlO/Al_2O_3/HfAlO$ (HAH with $Al_2O_3+1000°$ C. PDA), $HfAlO/Al_2O_3/HfAlO$ (HaH with no $Al_2O_3$ PDA) and $Al_2O_3/HfAlO/Al_2O_3$ (Aha with both $Al_2O_3+1000°$ C. PDA and $Al_2O_3$ with no PDA) were deposited as IGD structures according to Table 1 below. The thicknesses of different layers were chosen in order to match the EOT of single layer 17 nm $Al_2O_3$ reference.

TABLE 1

| IGD | Layer type | Thickness (nm) | PDA details (° C.) |
|---|---|---|---|
| $Al_2O_3$ | AHa | 5 | 1000 |
| HfAlO | | 10 | 800 |
| $Al_2O_3$ | | 5 | — |
| HfAlO | HaH | 10 | 800 |
| $Al_2O_3$ | | 5 | — |
| HfAlO | | 10 | 800 |
| HfAlO | HAH | 10 | 800 |
| $Al_2O_3$ | | 5 | 1000 |
| HfAlO | | 10 | 800 |

For the three IGD structures in Table 1, interfaces were well-defined between the HfAlO and $Al_2O_3$ layers, as wells as with the TiN from the HFG structure and the CG structure. The HfAlO layers appeared to be around 8 nm thick due to contraction during the 800° C. PDA process.

Figure 14:
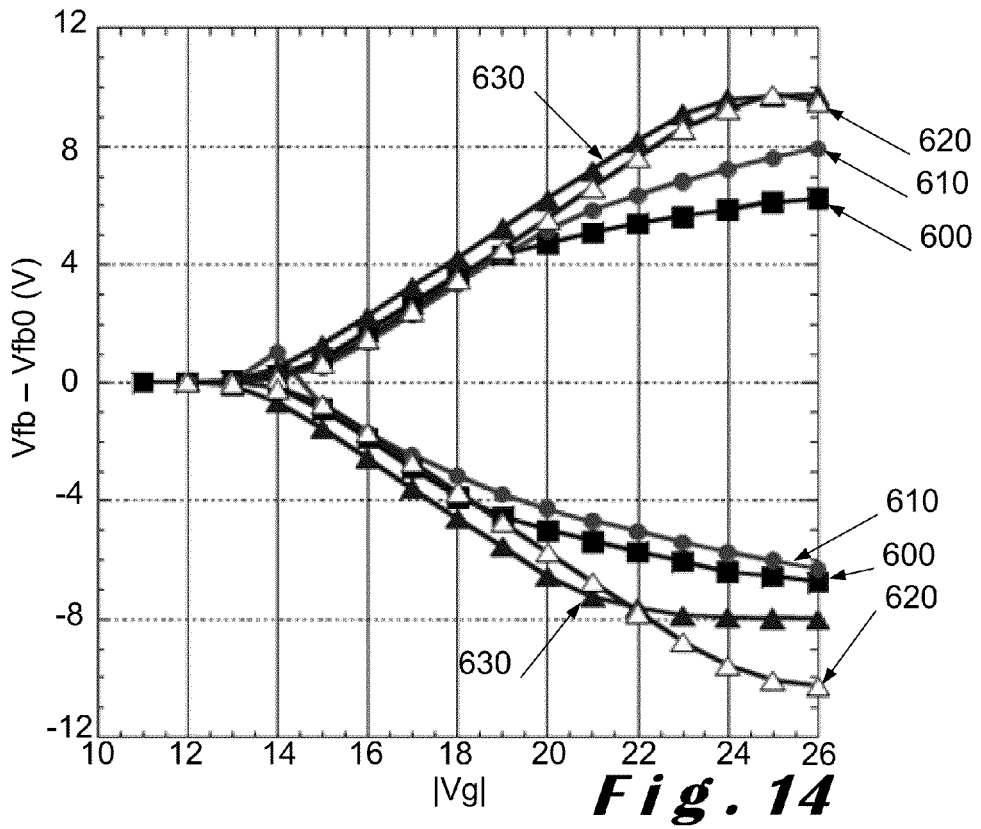
FIG. 14 is a graph illustrating incremental step pulse programming/erasing characteristics for three-layer inter-gate dielectric stacks, according to some embodiments.

FIG. 14 shows the ISPP and ISPE characteristics of the three-layer structures or stacks, compared to a single layer $Al_2O_3$ IGD reference structure. The $Al_2O_3$ IGD reference structure is indicated by line 600 (solid squares), the AHa structure by line 610 (solid circles), the HaH structure by line 620 (outlined triangles), and the HAH structure by line 630 (solid triangles).

The experimental results confirm the simulations. A huge improvement of the program/erase (P/E) window is obtained with respect to the $Al_2O_3$ IGD reference structure. Due to the low leakage of such a structure, the 1:1 ISPP slope regime is extended until a programmed Vfb shift of 9V, before saturation occurs. The total P/E window can be as large as 18V, the erase window becoming larger when the middle $Al_2O_3$ is kept amorphous (no PDA) as in the HaH structure. On the other hand, limited benefit is obtained from the AHa structure. A slight improvement is observed with respect to the $Al_2O_3$ IGD reference structure, because the $Al_2O_3$ layers of the stack were made sufficiently thick to avoid the variot effect, and the HfAlO layer in the middle helps reducing the IGD leakage.

The high-k/low-k/high-k configuration can also be obtained with $SiO_2$ as middle layer, $HfAlO$—$SiO_2$—$HfAlO$ (HOH), targeting similar EOT as the HaH stacks. Well defined interfaces between HfAlO and $SiO_2$ were also observed.

Figure 15:
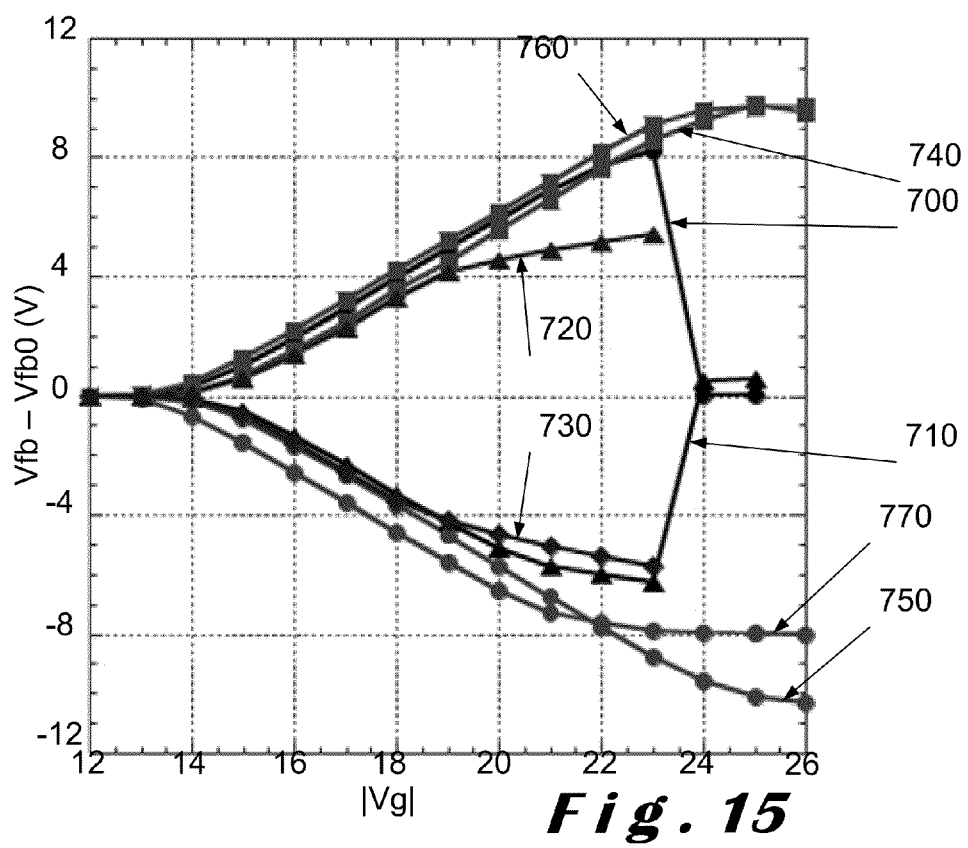
FIG. 15 is graph illustrating incremental step pulse programming/erasing characteristics of different inter-gate dielectric stacks according to some embodiments, compared to aluminium oxide.
Figure 16:
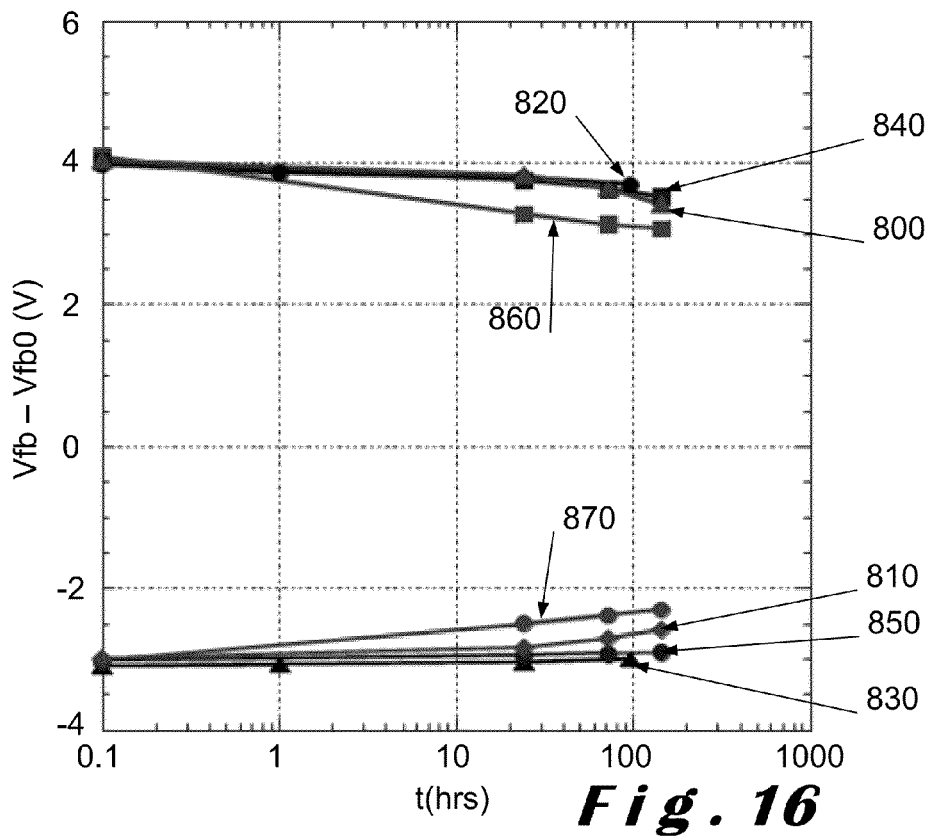
FIG. 16 is a graph illustrating the corresponding retention characteristics for the inter-gate dielectric stacks of FIG. 15 at a bake temperature of 125° C.

FIGS. 15 and 16 illustrate benchmarking of the different stacks, in terms of ISPP and ISPE (FIG. 15) and retention (FIG. 16). In FIG. 15, the ISPP and ISPE characteristics for a HOH structure (indicated by lines 700 and 710) also allows the extension of the 1:1 slope regime when compared to a single layer $Al_2O_3$ (indicated by lines 720 and 730) thus confirming the validity of the high-k/low-k/high-k layered IGD structure with other materials. However, although the EOT of the HOH stack is similar to the HaH structure (indicated by lines 740 and 750), it tended to break earlier, thus reaching a more limited window as compared to HaH structure. An HAH structure (indicated by lines 760 and 770) is also shown for comparison.

In FIG. 16, the lines are numbered similarly to those of FIG. 15 but with an '8' instead of a '7' on the front. The retention test showed negligible charge loss at bake temperatures as high as 125° C., except for the HAH case (1000° C. PDA after middle $Al_2O_3$). It is expected that this high temperature causes too much crystallization of the bottom HfAlO layer resulting in slightly degraded retention properties.

Figure 17:
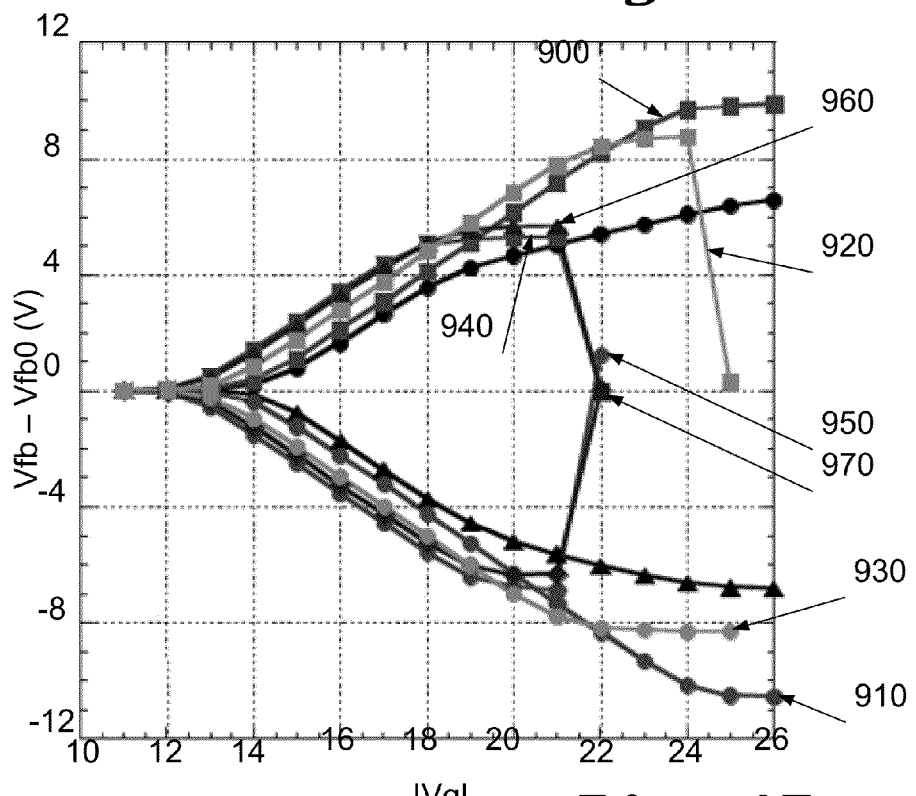
FIG. 17 is a graph illustrating incremental step pulse programming/erasing characteristics of capacitors for an inter-gate stack having different thickness combinations, according to some embodiments.

Having identified a possible HaH structure or stack, the thickness scalability was investigated. The results are shown in FIG. 17. The thicknesses and the EOT for each HaH structure or stack tested are shown in Table 2 below together with the relevant reference numbers.

TABLE 2

| Thickness (nm) | | | | Reference |
|---|---|---|---|---|
| H | a | H | EOT (nm) | numbers |
| 8 | 5 | 8 | 6.6 | 900, 910 |
| 8 | 5 | 4 | 5.3 | 920, 930 |
| 4 | 5 | 4 | 4.5 | 940, 950 |
| 6 | 4 | 4 | 4.7 | 960, 970 |

Indeed, for program voltage scaling, a better coupling is required (lower EOT of the IGD structure). In addition, the physical thickness of the stack should not be too large with respect to fringing field issues when integrated in tight pitch arrays. Since the P/E window is symmetrical (±9V), and multi-level operation uses three positive levels of charge (for programming) and one negative level (for erasing), the top HfAlO layer can safely be made thinner because it mostly affects the erase operation (barrier towards electron injection from the CG structure during erasing), while the bottom HfAlO layer thickness is more critical since it affects the programming operation (current passing through the IGD structure during programming).

It has been determined that the HaH IGD structure can be scaled down to 8 nm/5 nm/4 nm with about only 1V loss in program window and about 2V in erase window, but with a gain of 1V in P/E voltages, and a more reasonable total physical thickness of 17 nm. It is important to note that this HaH structure or stack provides a much larger P/E window than a single $Al_2O_3$ layer reference (not shown), although it has a lower EOT (for identical materials, lower EOT leads to lower P/E window). On the other hand, scaling further the HaH structure by reducing the bottom HfAlO layer thickness brings too low P/E window, also because the IGD structure has too low total EOT in this case.

Figure 18:
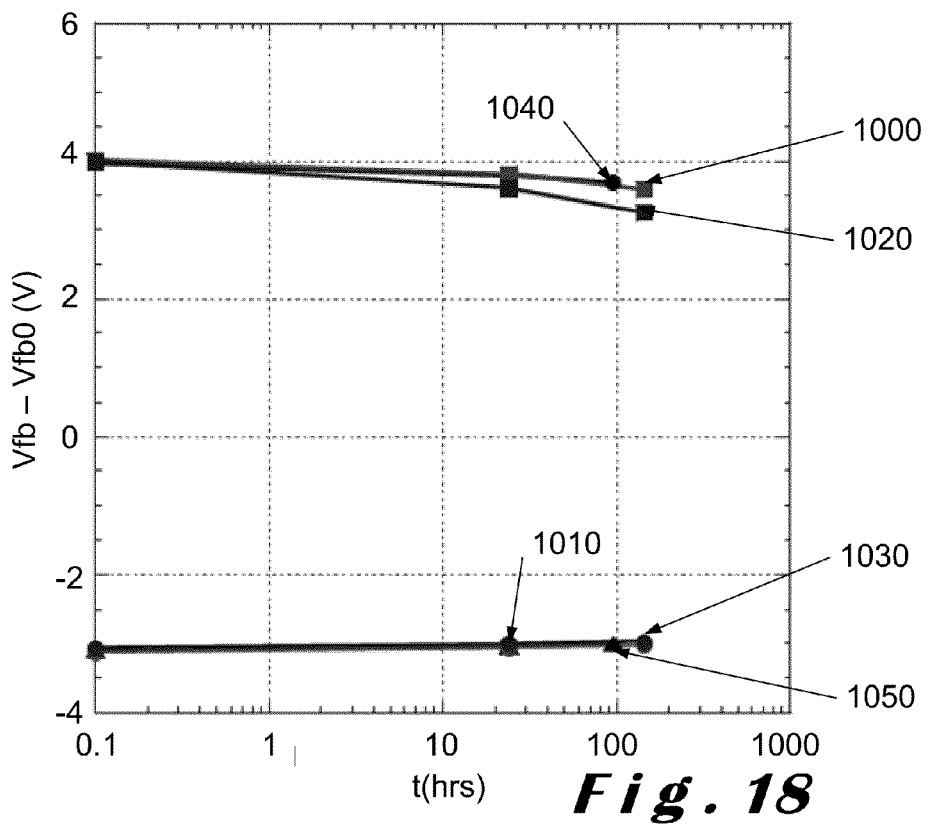
FIG. 18 is a graph illustrating retention at 125° C. of capacitors having the exemplary inter-gate stack of FIG. 10 with reduced thickness.

FIG. 18 shows that a scaled down version of such an HaH structure or stack still shows very good retention up to 125° C. The retention results for a structure having thicknesses 10 nm/5 nm/10 nm is shown at lines 1000 and 1010 and for a structure having thicknesses of 10 nm/5 nm/5 nm is shown at lines 1020 and 1030. For comparison, the results for an AlO structure are also shown at lines 1040 and 1050.

Figure 19:
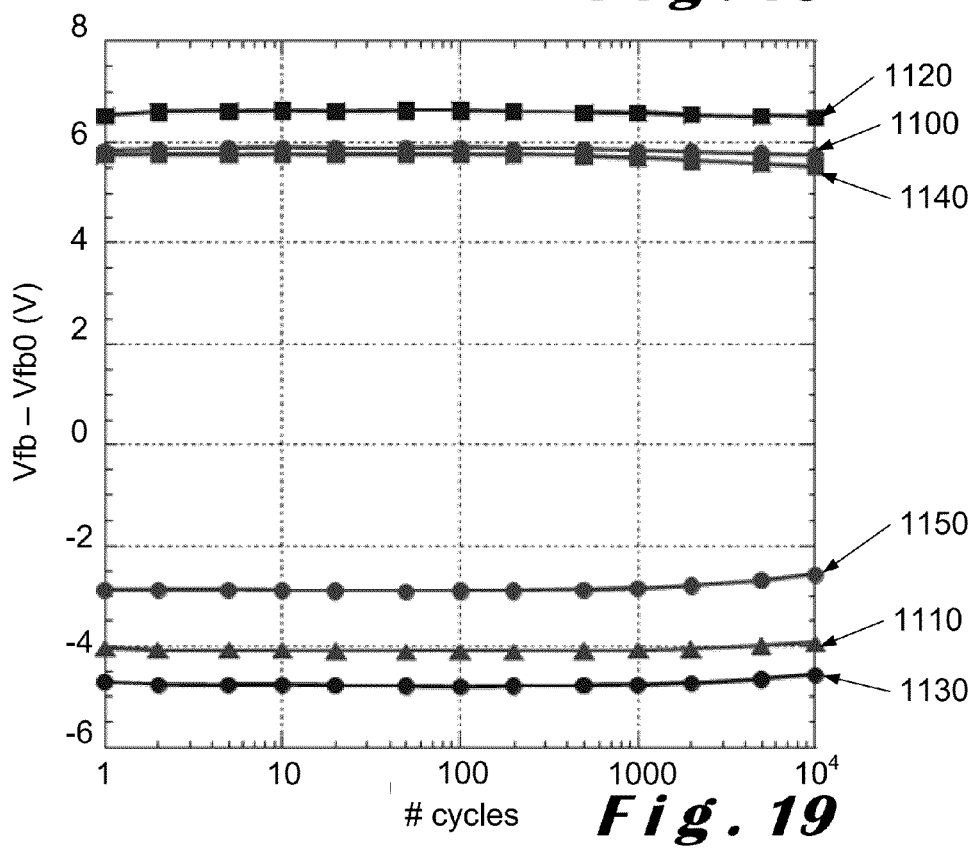
FIG. 19 is a graph illustrating cycling endurance characteristics of two types of inter-gate dielectric stacks according to some embodiments.

FIG. 19 shows P/E cycling endurance for three different IGD structures or stacks. An HaH structure having thicknesses of 10 nm/5 nm/10 nm is shown at lines 1100 and 1110 and a similar structure but with thicknesses of 10 nm/5 nm/5 nm is shown at lines 1120 and 1130. An HOH structure having thicknesses of 5 nm/5 nm/5 nm is also shown at lines 1140, 1150 for comparison. Even at a large P/E window, no shift is observed up to 10,000 P/E cycles. Indeed, the devices operate in the 1:1 ISPP and ISPE slope regime, where very limited trapping in the IGD structure is expected.

Combined with a HFG featuring a high work-function (WF) metal on top of Si, a three-layer IGD structure made of high-k/low-k/high-k materials is very promising to enable a large P/E window in planar NAND flash device. The quality of the dielectric materials has to be carefully controlled, however, in order to avoid IGD leakage that would compromise the device performance. Due to the good morphological properties of HfAlO, and its good stability with TiN, a HfAlO—Al2O3-HfAlO stack has been successfully used as IGD structure on a Si/TiN HFG, demonstrating a very large Program/Erase window together with excellent retention and endurance.

Figure 20:
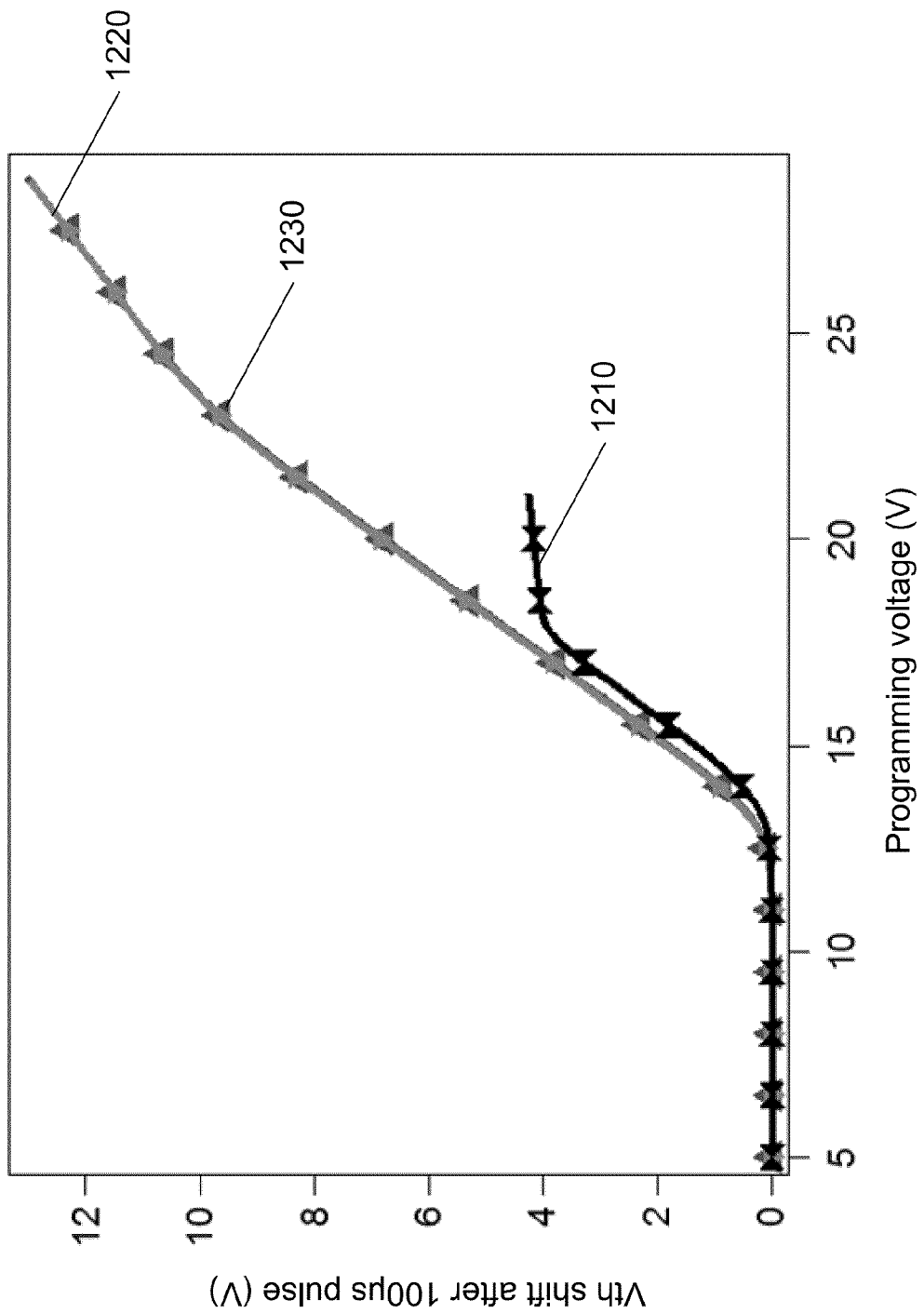
FIG. 20 is a graph illustrating a comparison between incremental step pulse programming/erasing characteristics for a structure having different interfacial layers between the floating gate structure and the inter-gate dielectric structure or stack and/or between the inter-gate dielectric structure and the control gate structure, according to some embodiments.

FIG. 20 illustrates a comparison between voltage shift/programming voltage characteristics for structures having different interfacial layers. Line 1210 (indicated by bow-ties) illustrates the characteristic for a structure having two low-k interfacial layers; line 1220 (indicated by triangles) illustrates the characteristic for a structure having a single high-k interfacial layer between the FG structure and the IGD structure; and line 1230 (indicated by inverted triangles) illustrates the characteristic for a structure having two high-k interfacial layers. It can clearly be seen that the presence of at least one high-k interfacial layer within the structure enables a higher programming voltage to be used.

Example embodiments are illustrated in referenced Figures of the drawings. It is intended that the embodiments and figures disclosed herein are to be considered illustrative rather than restrictive. In addition, it will be appreciated that the present disclosure is not limited to the materials described above and that other suitable materials may be used for creating a three-layer IGD structure, and in particular, one with characteristics similar or identical to the characteristics of a HaH IGD structure.

In addition, the HaH IGD structure can be used in the embodiments of the present disclosure as described above with reference to FIGS. 1 and 2. The presence of the second interfacial layer 180 in FIG. 2, provided that it is electrically transparent and has a high k-value, does not detract from the performance of an NVM device having a HaH IGD structure.

Although specific examples are given above with respect to HaH IGD structures, it will be appreciated that, depending on the particular application and the P/E windows required, HAH and HOH IGD structures can also be used. Both HAH and HOH structures provide good P/E windows although HOH structures may be subject to parasitic variot effects.

It has been shown that it is possible to scale planar NVM devices as described above down to 10 nm cells using the HAH and HOH IGD structures. By having a higher WF metal FG, the programming window can be improved as the change in WF has a strong positive effect on programming saturation performance.

It will be appreciated that IGD structures may be made from suitable materials listed above and that HfAlO, $SiO_2$, and $Al_2O_3$ were found to be particularly advantageous.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A non-volatile memory device comprising:
a semiconductor substrate;
a tunnel dielectric formed on the substrate;
a floating gate formed on the tunnel dielectric, wherein the floating gate comprises a hybrid floating gate structure including a lower layer and an upper metal layer;
a first interfacial layer formed on the floating gate;
an inter-gate dielectric stack formed on the first interfacial layer; and
a control gate formed on the inter-gate dielectric stack,
wherein the inter-gate dielectric stack comprises a first layer, a second layer and a third layer, the first layer being formed on the first interfacial layer and the control gate structure being formed on the third layer, the first and third layers having a higher k-value than the second layer which is sandwiched therebetween, and
wherein the first interfacial layer comprises a high k-value material.

2. The non-volatile memory device according to claim 1, wherein the first interfacial layer comprises a metal element included in the upper metal layer of the hybrid floating gate structure.

3. The non-volatile memory device according to claim 1, wherein the first and third layers of the inter-gate dielectric stack comprise hafnium aluminate.

4. The non-volatile memory device according to claim 1, wherein the second layer of the inter-gate dielectric stack comprises at least one of aluminum oxide and silicon oxide.

5. The non-volatile memory device according to claim 1, wherein the first interfacial layer has a k-value that is higher than a k-value of the first layer of the inter-gate dielectric stack.

6. The non-volatile memory device according to claim 1, further comprising a second interfacial layer formed between the inter-gate dielectric stack and the control gate.

7. The non-volatile memory device according to claim 6, wherein the second interfacial layer has a k-value that is higher than a k-value of the third layer of the inter-gate dielectric stack.

8. The non-volatile memory device according to claim 6, wherein the second interfacial layer comprises a metal element included in the control gate.

9. The non-volatile memory device according to claim 6, wherein each of the first and second interfacial layers has a thickness less than about 1 nm.

10. The non-volatile memory device according to claim 9, wherein each of the first and second interfacial layers has a thickness in the range from 0.1 nm to 0.7 nm.

11. A method of manufacturing a non-volatile memory device, comprising:
- forming a tunnel dielectric on a semiconductor substrate;
- forming a floating gate on the tunnel dielectric, comprising:
  - forming a lower layer, and
  - forming an upper metal layer;
- forming a first interfacial layer on of the floating gate, the first interfacial layer comprising a high-k dielectric material;
- forming an inter-gate dielectric stack on the first interfacial layer, the inter-gate dielectric stack comprising a first layer, a second layer and a third layer,
  - wherein the second layer is interposed between the first and third layers, and
  - wherein the first and third layers have a higher k-value than the second layer; and
- forming a control gate on the inter-gate dielectric stack.

12. The method according to claim 11, wherein forming the first interfacial layer comprises forming the first interfacial layer as a part of a formation process for forming the first layer of the inter-gate dielectric stack.

13. The method according to claim 11, further comprising forming a second interfacial layer on the inter-gate dielectric stack prior to forming the control gate.

14. The method according to claim 13, wherein forming the second interfacial layer comprises forming the second interfacial layer as a part of a formation process for forming the third layer of the inter-gate dielectric stack.

15. A non-volatile memory device comprising:
- a semiconductor substrate;
- a memory cell stack comprising a tunnel dielectric, a hybrid floating gate, an intergate dielectric stack, and a control gate,
- wherein the hybrid floating gate is interposed between the tunnel dielectric and the integrate dielectric stack and comprises a stack including a semiconductor material on the tunnel dielectric and a metallic material on the semiconductor material, and
- wherein the intergate dielectric stack is interposed between the hybrid floating gate and the control gate and comprises a stack including a high barrier material interposed between two low barrier materials, wherein the high barrier material has a higher conduction band compared to the low barrier materials, and wherein the high barrier material has a lower k-value compared the low barrier materials; and
- an interfacial material formed between the metallic material and a closer one of the low barrier materials, wherein the interfacial material comprises a mixture of at least one metallic element of the metallic material and the closer one of the low barrier materials.

16. The non-volatile memory device of claim 15, wherein the interfacial material has a lower conduction band compared to the low barrier materials, and has a higher k-value compared to the low barrier materials.

17. The non-volatile memory device of claim 15, wherein a combination of the k-value and a thickness of the interfacial material is chosen such that under a programming condition in which a voltage difference between the substrate and the control gate exceeds 12 V, a voltage drop across the interfacial material is less than about 500 mV.

18. The non-volatile memory device of claim 15, wherein the interfacial material comprises Ti.

19. The non-volatile memory device of claim 17, wherein the hybrid floating gate comprises:
- the semiconductor material comprising silicon doped with an n-type dopant; and
- the metallic material comprising sufficiently high work function such that under the programming condition, the conduction band of the semiconductor material bends upwards towards the metallic material.

20. The non-volatile memory of claim 15, further comprising a second interfacial material formed between the control gate and a closer one of the low barrier materials, wherein the second interfacial material comprises a mixture of at least one metallic element of the control gate and the closer one of the lower barrier materials.

* * * * *